(12) United States Patent
Tamura et al.

(10) Patent No.: US 12,279,362 B2
(45) Date of Patent: Apr. 15, 2025

(54) ISOLATOR

(71) Applicants: Kabushiki Kaisha Toshiba, Tokyo (JP); Toshiba Electronic Devices & Storage Corporation, Tokyo (JP)

(72) Inventors: Yoshinari Tamura, Yokohama Kanagawa (JP); Yusuke Imaizumi, Kawasaki Kanagawa (JP); Jia Liu, Yokohama Kanagawa (JP); Daijo Chida, Yokohama Kanagawa (JP); Minoru Takizawa, Sagamihara Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 244 days.

(21) Appl. No.: 18/173,767

(22) Filed: Feb. 23, 2023

(65) Prior Publication Data
US 2024/0090120 A1  Mar. 14, 2024

(30) Foreign Application Priority Data
Sep. 12, 2022 (JP) .................................. 2022-144390

(51) Int. Cl.
*H05K 1/02* (2006.01)
*H05K 1/11* (2006.01)
(Continued)

(52) U.S. Cl.
CPC ........... *H05K 1/0216* (2013.01); *H05K 1/111* (2013.01); *H05K 1/115* (2013.01); *H05K 1/165* (2013.01); *H05K 1/181* (2013.01)

(58) Field of Classification Search
CPC ...... H05K 1/0216; H05K 1/111; H05K 1/115; H05K 1/165; H05K 1/181
(Continued)

(56) References Cited

U.S. PATENT DOCUMENTS 9,035,422 B2  5/2015 Khanolkar
2020/0411434 A1  12/2020 Nakashiba
(Continued)

FOREIGN PATENT DOCUMENTS

JP  2021005598 A  1/2021
JP  2021082673 A  5/2021
(Continued)

*Primary Examiner* — Binh B Tran
(74) *Attorney, Agent, or Firm* — Kim & Stewart LLP

(57) ABSTRACT

According to one embodiment, an isolator includes: a first semiconductor chip; a second semiconductor chip; a first wiring board including a first surface provided thereon with the first semiconductor chip; a second wiring board including a second surface provided thereon with the second semiconductor chip, the second wiring board being spaced apart from the first wiring board; a third wiring board spaced apart from each of the first and second wiring boards; a first coil on the first surface; a second coil on the second surface; a third coil on a third surface of the third wiring board, the third surface facing the first and second surfaces, the third coil facing the first coil; a fourth coil on the third surface, facing the second coil, and electrically coupled to the third coil; and an insulator provided between the first to fourth coils.

20 Claims, 23 Drawing Sheets

(51) Int. Cl.
*H05K 1/16* (2006.01)
*H05K 1/18* (2006.01)

(58) Field of Classification Search
USPC .......................................................... 361/783
See application file for complete search history.

(56) References Cited

U.S. PATENT DOCUMENTS

| | | |
|---|---|---|
| 2021/0151394 A1* | 5/2021 | Uchida ............... H01L 23/5227 |
| 2021/0296265 A1 | 9/2021 | Fuji |
| 2021/0296427 A1 | 9/2021 | Ishiguro |
| 2021/0343641 A1 | 11/2021 | Kuwabara |
| 2023/0060493 A1* | 3/2023 | Wu ........................ H10K 59/40 |
| 2023/0093818 A1 | 3/2023 | Murasaki et al. |
| 2023/0309228 A1 | 9/2023 | Imaizumi et al. |

FOREIGN PATENT DOCUMENTS

| | | | |
|---|---|---|---|
| JP | 2021150579 | A | 9/2021 |
| JP | 2021150830 | A | 9/2021 |
| JP | 2021174955 | A | 11/2021 |
| JP | 2023-046880 | A | 4/2023 |
| JP | 2023-141929 | A | 10/2023 |

* cited by examiner

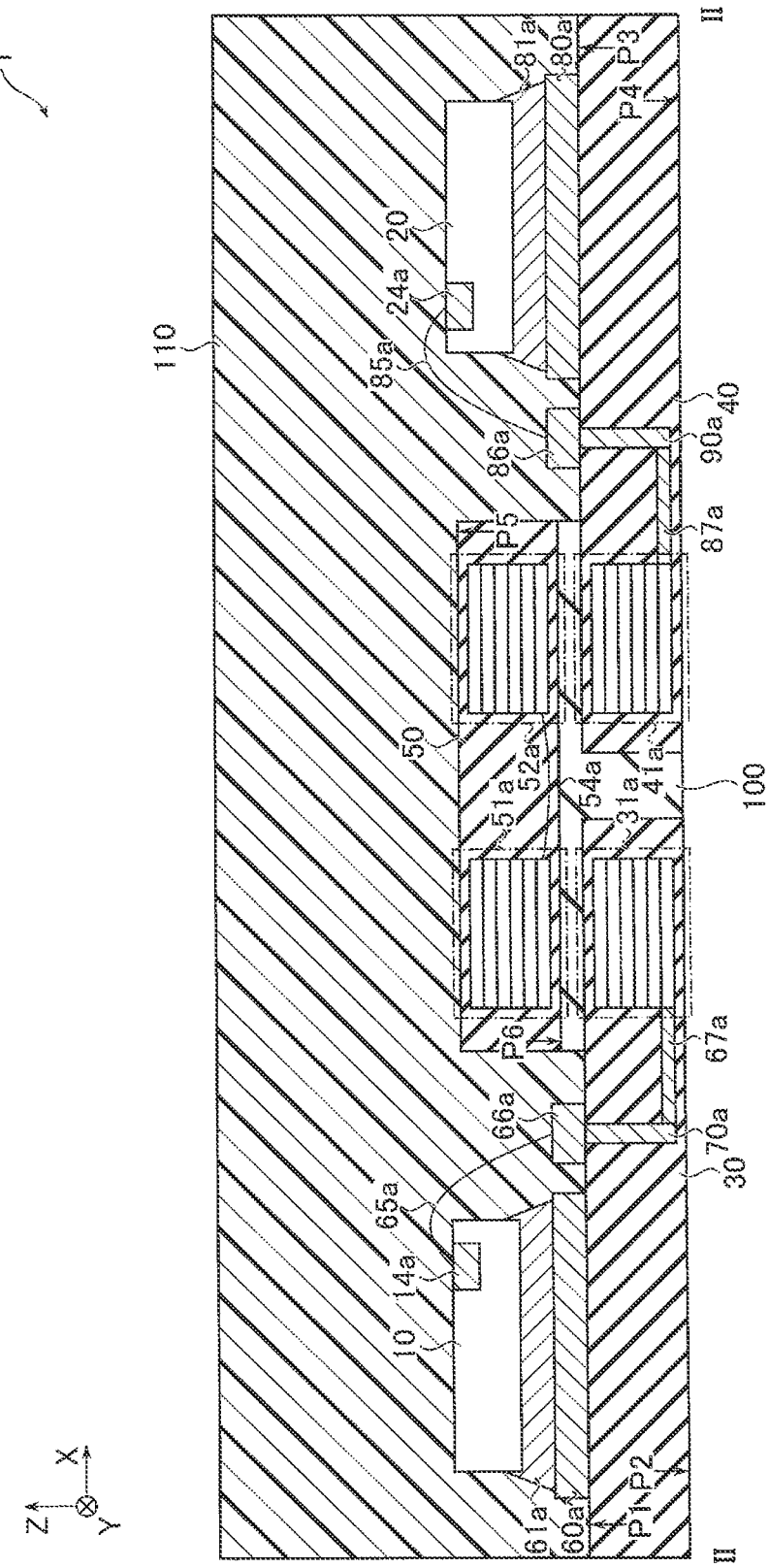
F I G. 12

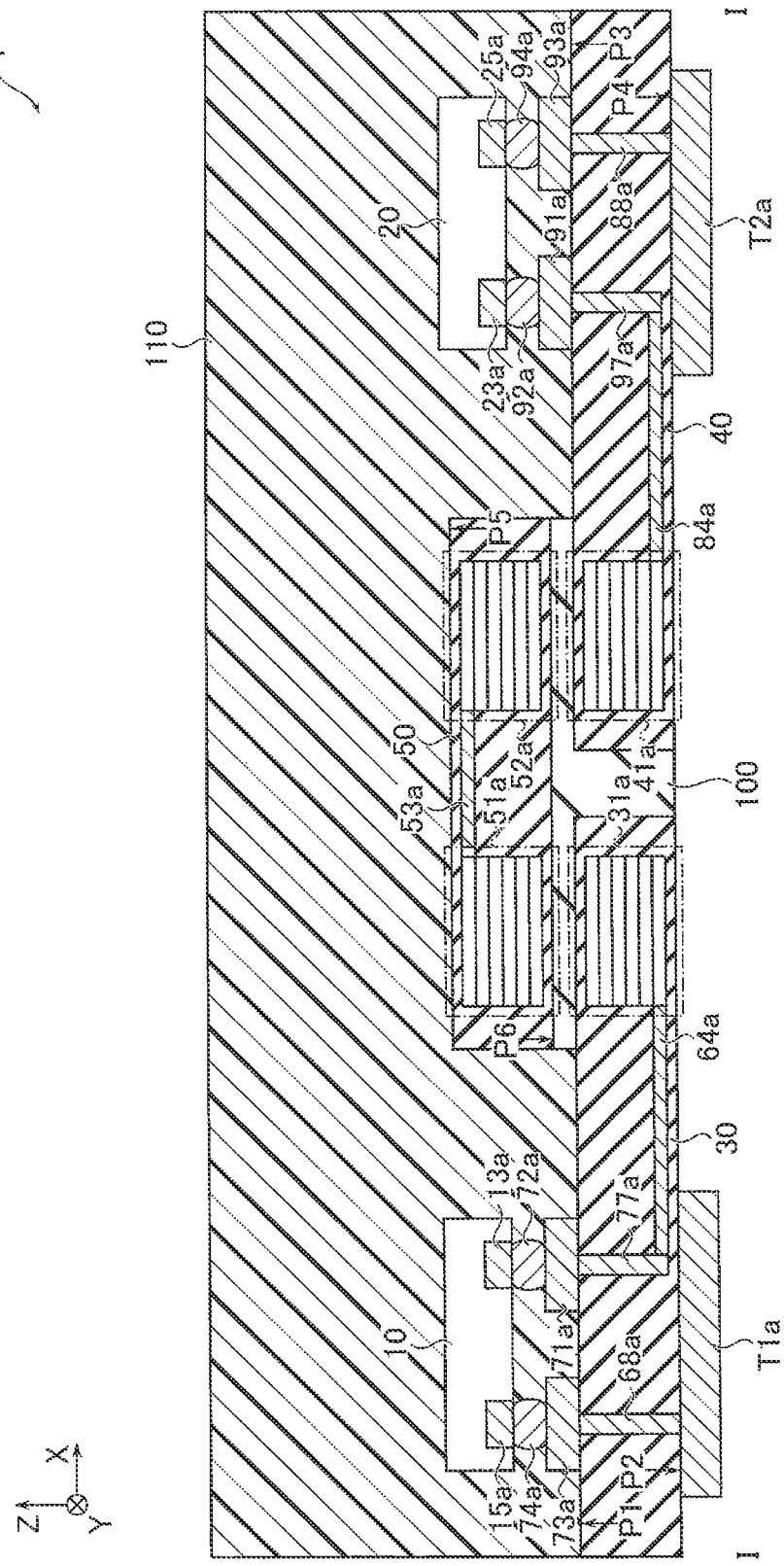
F I G. 22

ISOLATOR

CROSS-REFERENCE TO RELATED APPLICATIONS

This application is based upon and claims the benefit of priority from Japanese Patent Application No. 2022-144390, filed Sep. 12, 2022, the entire contents of which are incorporated herein by reference.

FIELD

Embodiments described herein relate generally to an isolator.

BACKGROUND

An isolator configured to transmit a signal from a transmission side circuit to a reception side circuit in a state in which the transmission side circuit and the reception side circuit are insulated is known.

BRIEF DESCRIPTION OF THE DRAWINGS

FIG. 12 is a sectional view showing an example of a sectional structure of the isolator according to the second modification of the first embodiment.

FIG. 22 is a sectional view showing an example of a sectional structure of the isolator according to the second modification of the second embodiment.

DETAILED DESCRIPTION

Figure 1:
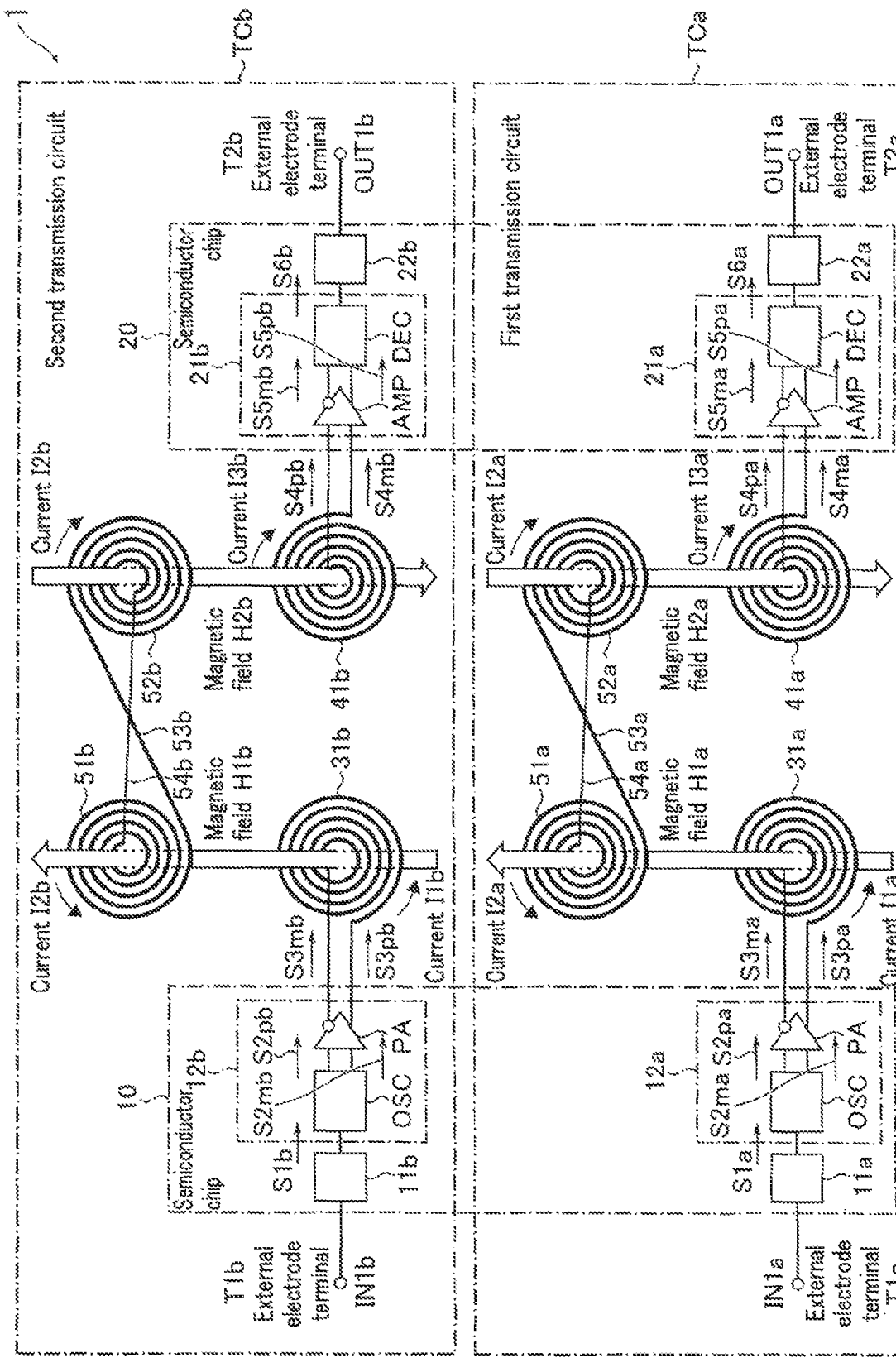
FIG. 1 is a circuit diagram showing an example of a circuit configuration of an isolator according to a first embodiment.

In general, according to one embodiment, an isolator includes: a first semiconductor chip; a second semiconductor chip; a first wiring board including a first surface facing in a first direction, the first surface being provided thereon with the first semiconductor chip; a second wiring board including a second surface facing in the first direction, the second surface being provided thereon with the second semiconductor chip, the second wiring board being spaced apart from the first wiring board in a second direction intersecting the first direction; a third wiring board spaced apart from each of the first wiring board and the second wiring board in the first direction; a first coil provided on the first surface of the first wiring board and electrically coupled to the first semiconductor chip; a second coil provided on the second surface of the second wiring board and electrically coupled to the second semiconductor chip; a third coil provided on a third surface of the third wiring board, the third surface facing the first surface of the first wiring board and the second surface of the second wiring board, the third coil facing the first coil; a fourth coil provided on the third surface of the third wiring board, facing the second coil, and electrically coupled to the third coil; and an insulator provided between the first coil and the second coil, between the first coil and the third coil, between the second coil and the fourth coil, and between the third coil and the fourth coil.

Hereinafter, embodiments will be described with reference to the accompanying drawings. The dimensions and ratios in the drawings are not always the same as the actual ones. In the following description, constituent elements having substantially the same function and configuration will be assigned the same reference numeral or symbol and repetitive descriptions may be omitted. In the case where elements having similar configurations are distinguished from each other in particular, their identical reference symbols may be assigned different letters or numbers. All of the descriptions of an embodiment are applicable as descriptions of another embodiment, unless explicitly or self-evidently excluded.

1. First Embodiment

An isolator according to a first embodiment will be described. The following will describe an example of an isolator, which is configured to transmit a signal from a transmission side circuit (primary-side circuit) to a reception side circuit (secondary-side circuit) in a state in which the transmission side circuit and the reception side circuit are isolated, by coupling magnetically between a coil coupled to the transmission side circuit and a coil coupled to the reception side circuit.

1.1 Circuit Configuration of Isolator

A circuit configuration of an isolator will be described with reference to FIG. 1. FIG. 1 is a circuit diagram showing an example of the circuit configuration of the isolator.

An isolator 1 is, for example, a semiconductor package. FIG. 1 shows an example in which the number of channels for the isolator 1 is two. The isolator 1 transmits a signal from a transmission side circuit to a reception side circuit for each channel with these circuits being insulated from each other. Hereinafter, two channels will be respectively referred to as a "first channel" and a "second channel". A constituent element corresponding to the first channel will be distinguished by the additional alphabet "a" after the reference numeral or symbol. A constituent element corresponding to the second channel will be distinguished by the additional alphabet "b" after the reference numeral or symbol. For the isolator 1, the number of channels may be one, or three or more.

The isolator 1 includes semiconductor chips (hereinafter referred to as "chips") 10 and 20, external electrode terminals T1a, T1b, T2a, and T2b, coils 31a, 31b, 41a, 41b, 51a, 51b, 52a, and 52b, and interconnects 53a, 53b, 54a, and 54b.

The chip 10 is, for example, an integrated circuit (IC) chip. The chip 10 corresponds to the transmission side circuit. The chip 10 includes, for example, electronic circuits 11a and 11b, and transmission circuits 12a and 12b. The electronic circuits 11a and 11b and the transmission circuits 12a and 12b will be described later in detail. A power supply voltage VDD and a ground voltage VSS are supplied to the chip 10.

The chip 20 is, for example, an IC chip. The chip 20 corresponds to the reception side circuit. The chip 20 includes, for example, reception circuits 21a and 21b, and electronic circuits 22a and 22b. The reception circuits 21a and 21b and the electronic circuits 22a and 22b will be described later in detail. The power supply voltage VDD and the ground voltage VSS are supplied to the chip 20.

In the following, a circuit configured to transmit a signal corresponds to the first channel and a circuit configured to transmit a signal corresponds to the second channel will be respectively referred to as a "first transmission circuit TCa" and a "second transmission circuit TCb", and constituent elements of the isolator 1 will be described for each transmission circuit.

The first transmission circuit TCa includes the external electrode terminal T1a, the electronic circuit 11a, the transmission circuit 12a, the coils 31a, 41a, 51a, and 52a, and the interconnects 53a and 54a, the reception circuit 21a, the electronic circuit 22a, and the external electrode terminal T2a.

A signal IN1a is input from an outside to the external electrode terminal T1a.

The electronic circuit 11a includes, for example, a modulation circuit. The electronic circuit 11a modulates (for example, performs amplitude shift keying) the input signal IN1a received via the external electrode terminal T1a from an outside, and transmits the modulated signal S1a to the transmission circuit 12a.

The transmission circuit 12a includes, for example, an oscillator OSC and a power amplifier PA.

The oscillator OSC generates, based on a signal S1a received from the electronic circuit 11a, an inversion signal S2ma of the signal S1a. The oscillator OSC transmits the received signal S1a as a non-inversion signal S2pa to a non-inversion input terminal of the power amplifier PA. The oscillator OSC transmits the generated inversion signal S2ma to an inversion input terminal of the power amplifier PA.

The power amplifier PA amplifies the non-inversion signal S2pa received from the oscillator OSC and transmits an amplified non-inversion signal S3pa to one end of the coil 31a. The power amplifier PA amplifies the inversion signal S2ma received from the oscillator OSC and transmits an amplified inversion signal S3ma to the other end of the coil 31a.

One end of the coil 31a is coupled to a non-inversion output terminal of the power amplifier PA. The other end of the coil 31a is coupled to an inversion output terminal of the power amplifier PA. Of the two ends of the coil 31a, hereinafter, the one end coupled to the non-inversion output terminal of the power amplifier PA will also be referred to as a "first end", and the other end coupled to the inversion output terminal of the power amplifier PA will also be referred to as a "second end".

The coil 41a is arranged with a space from the coil 31a. One end of the coil 41a is coupled to an inversion input terminal of an amplifier AMP to be described later. The other end of the coil 41a is coupled to a non-inversion input terminal of the amplifier AMP. Of the two ends of the coil 41a, hereinafter, the one end coupled to an inversion input terminal of the amplifier AMP will also be referred to as a "first end", and the other end coupled to a non-inversion input terminal of the amplifier AMP of the coil 41a will also be referred to as a "second end".

The coil 51a is arranged above the coil 31a. One end of the coil 51a is coupled to one end of the interconnect 53a. The other end of the coil 51a is coupled to one end of the interconnect 54a. Of the two ends of the coil 51a, hereinafter, the one end coupled to the interconnect 53a will also be referred to as a "first end", and the other end coupled to the interconnect 54a will also be referred to as a "second end".

The coil 52a is arranged above the coil 41a. One end of the coil 52a is coupled to the other end of the interconnect 53a. The other end of the coil 52a is coupled to the other end of the interconnect 54a. Of the two ends of the coil 52a, hereinafter, the one end coupled to the interconnect 53a will also be referred to as a "first end", and the other end coupled to the interconnect 54a will also be referred to as a "second end".

The reception circuit 21a includes, for example, the amplifier AMP and a detection circuit DEC. The amplifier AMP amplifies an inversion signal S4ma received from one end of the coil 41a and transmits an amplified inversion signal S5ma to the detection circuit DEC. The amplifier AMP amplifies a non-inversion signal S4pa received from the other end of the coil 41a and transmits an amplified non-inversion signal S5pa to the detection circuit DEC.

The detection circuit DEC detects the non-inversion signal S5pa from the non-inversion signal S5pa and the inversion signal S5ma both received from the amplifier AMP. The detection circuit DEC transmits the detected non-inversion signal S5pa as a signal S6a to the electronic circuit 22a.

The electronic circuit 22a includes, for example, a demodulation circuit. The electronic circuit 22a demodulates the signal S6a received from the detection circuit DEC and outputs the demodulated signal as an output signal OUT1a to an outside via the external electrode terminal T2a.

The second transmission circuit TCb includes the external electrode terminal T1b, the electronic circuit 11b, the transmission circuit 12b, the coils 31b, 41b, 51b, and 52b, the interconnects 53b and 54b, the reception circuit 21b, the electronic circuit 22b, and the external electrode terminal T2b.

The external electrode terminals T1b and T2b respectively correspond to the external electrode terminals T1a and T2a.

The electronic circuit 11b corresponds to the electronic circuit 11a. The electronic circuit 11b has a configuration similar to that of the electronic circuit 11a.

The transmission circuit 12b corresponds to the transmission circuit 12a. The transmission circuit 12b has a configuration similar to that of the transmission circuit 12a.

The coils 31b, 41b, 51b, and 52b respectively correspond to the coils 31a, 41a, 51a, and 52b.

The interconnects 53b and 54b respectively correspond to the interconnects 53a and 54a.

The reception circuit 21b corresponds to the reception circuit 21a. The reception circuit 21b has a configuration similar to that of the reception circuit 21a.

The electronic circuit 22b corresponds to the electronic circuit 22a. The electronic circuit 22b has a configuration similar to that of the electronic circuit 22a.

The signals IN1b, S1b, S2pb, S2mb, S3pb, S3mb, S4pb, S4mb, S5pb, S5mb, S6b, and OUT1b respectively correspond to the signals IN1a, S1a, S2pa, S2ma, S3pa, S3ma, S4pa, S4ma, S5pa, S5ma, S6a, and OUT1a.

Currents I1b, I2b, and I3b respectively correspond to currents I1a, I2a, and I3a.

Magnetic fields H1b and H2b respectively correspond to magnetic fields H1a and H2a.

Coupling between the constituent elements of the second transmission circuit TCb is similar to that of the constituent elements of the first transmission circuit TCa.

1.2 Structure of Isolator

A structure of the isolator 1 will be described.

(Planar Structure)

Figure 2:
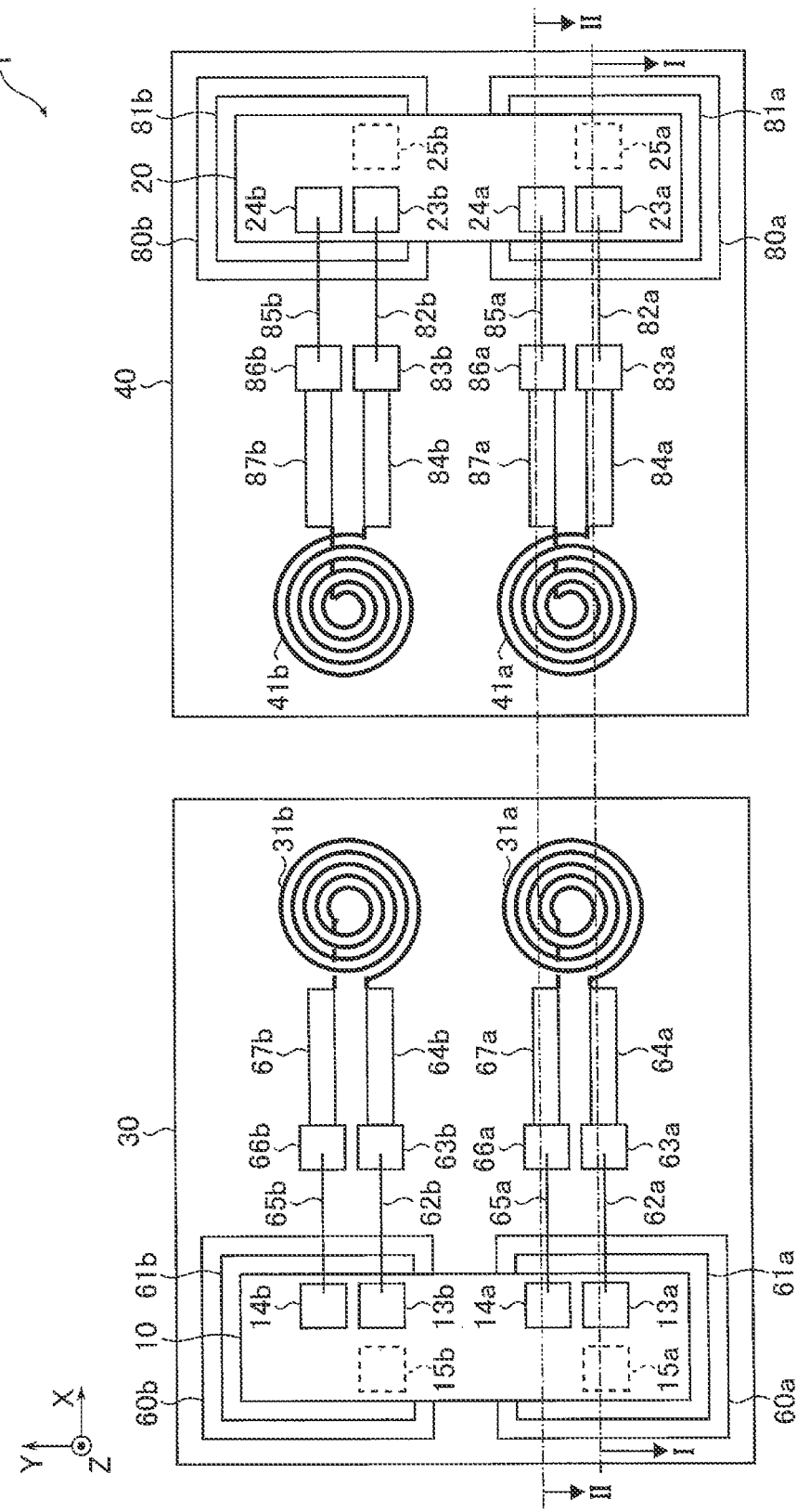
FIG. 2 is a plan view showing an example of a planar structure of the isolator according to the first embodiment.

FIG. 2 is a plan view showing an example of a planar structure of the isolator 1.

In addition to the constituent elements shown in FIG. 1, the isolator 1 further includes printed wiring boards (hereinafter referred to as a "wiring board") 30, 40, and 50, conductors 60a and 60b, attachment members 61a and 61b, interconnects 62a and 62b, pads 63a and 63b, interconnects 64a, 64b, 65a, and 65b, pads 66a and 66b, interconnects 67a and 67b, vias 68a and 68b, conductors 80a and 80b, attachment members 81a and 81b, interconnects 82a and 82b, pads 83a and 83b, interconnects 84a, 84b, 85a, and 85b, pads 86a and 86b, interconnects 87a and 87b, vias 88a and 88b, an insulator 100, and a resin 110. FIG. 2 omits the external electrode terminals T1a, T1b, T2a, and T2b, the wiring board 50, the coils 51a, 51b, 52a, and 52b, the interconnects 53a, 53b, 54a, and 54b, vias 68a, 68b, 88a, and 88b, the insulator 100, and the resin 110.

In the following description, a direction that is substantially parallel to a surface of the wiring board 30 and extends from the coil 31a to the coil 41a is defined as an X direction. A direction that is substantially parallel to the surface of the wiring board 30 and extends from the coil 31a to the coil 31b is defined as a Y direction. A direction that is substantially perpendicular to the surface of the wiring board 30 and extends from the coil 31a to the coil 51a is defined as a Z direction.

As shown in FIG. 2, the wiring board 30 is, for example, a flexible printed circuit (FPC) having a flexibility. The wiring board 30 is formed of, for example, an FPC material. The wiring board 30 is formed into, for example, a plate shape. The wiring board 30 includes a first surface and a second surface arranged side by side in the Z direction. The second surface faces the first surface. Hereinafter, of the surfaces of the wiring board 30, the one surface provided with the chip 10 will be referred to as a "first surface P1", and the other surface not provided with the chip 10 will be referred to as a "second surface P2". The wiring board 30 may be formed of, for example, a glass epoxy resin material or a Teflon (registered trademark) material. The wiring board 30 has a thickness of, for example, about 25 μm.

The coils 31a and 31b are provided on the first surface P1 of the wiring board 30. The coils 31a and 31b each include, for example, a conductor wound in a spiral fashion along the XY plane. The coils 31a and 31b are each formed into, for example, a circular shape. The coils 31a and 31b include, for example, copper. The coils 31a and 31b have a thickness of, for example, 6 μm or greater and 12 μm or smaller. The coils 31a and 31b may be formed into, for example, a rectangular shape or a polygonal shape.

The conductors 60a and 60b are each, for example, a member for placing the chip 10 thereon. The conductors 60a and 60b are provided on the first surface P1 of the wiring board 30. The conductors 60a and 60b are each formed into, for example, a plate shape. The conductors 60a and 60b are formed of, for example, a conductive material. The conductors 60a and 60b are, for example, copper foil.

The attachment member 61a is provided on the conductor 60a. The attachment member 61b is provided on the conductor 60b. The attachment members 61a and 61b are formed of, for example, a conductive material. The attachment members 61a and 61b are, for example, a silver paste.

The chip 10 is provided on the attachment members 61a and 61b. The chip 10 includes pads 13a, 13b, 14a, 14b, 15a, and 15b. The pads 13a, 13b, 14a, 14b, 15a, and 15b are, for example, electrode pads. The pads 13a, 13b, 14a, and 14b are provided on the upper surface of the chip 10. The pads 15a and 15b are provided on the lower surface of the chip 10. The pad 13a is used for coupling between the transmission circuit 12a and the pad 63a. The pad 13b is used for coupling between the transmission circuit 12b and the pad 63b. The pad 14a is used for coupling between the transmission circuit 12a and the pad 66a. The pad 14b is used for coupling between the transmission circuit 12b and the pad 66b. The pad 15a is used for coupling between the electronic circuit 11a and the attachment member 61a. The pad 15b is used for coupling between the electronic circuit 11b and the attachment member 61b. The pads 13a, 13b, 14a, 14b, 15a, and 15b are formed of, for example, a conductive material.

The interconnects 62a and 62b are, for example, bonding wire. One end of the interconnect 62a is coupled to the pad 13a. The other end of the interconnect 62a is coupled to the pad 63a. One end of the interconnect 62b is coupled to the pad 13b. The other end of the interconnect 62b is coupled to the pad 63b. The interconnect 62a couples electrically between the pad 13a and the pad 63a. The interconnect 62b couples electrically between the pad 13b and the pad 63b. The interconnects 62a and 62b are formed of, for example, a conductive material.

The pads 63a and 63b are, for example, electrode pads. The pads 63a and 63b are provided on the first surface P1 of the wiring board 30. The pad 63a is used for coupling between the pad 13a and the coil 31a. The pad 63b is used for coupling between the pad 13b and the coil 31b. The pads 63a and 63b are formed of, for example, a conductive material.

The interconnects 64a and 64b are provided on the first surface P1 of the wiring board 30. One end of the interconnect 64a is coupled to the pad 63a. The other end of the interconnect 64a is coupled to the first end of the coil 31a. One end of the interconnect 64b is coupled to the pad 63b. The other end of the interconnect 64b is coupled to the first end of the coil 31b. The interconnect 64a couples electrically between the pad 63a and the first end of the coil 31a. The interconnect 64b couples electrically between the pad 63b and the first end of the coil 31b. The interconnects 64a and 64b are formed of, for example, a conductive material.

The interconnects 65a and 65b are, for example, bonding wire. One end of the interconnect 65a is coupled to the pad 14a. The other end of the interconnect 65a is coupled to the pad 66a. One end of the interconnect 65b is coupled to the pad 14b. The other end of the interconnect 65b is coupled to the pad 66b. The interconnect 65a couples electrically between the pad 14a and the pad 66a. The interconnect 65b couples electrically between the pad 14b and the pad 66b. The interconnects 65a and 65b are formed of, for example, a conductive material.

The pads 66a and 66b are, for example, electrode pads. The pads 66a and 66b are provided on the first surface P1 of the wiring board 30. The pad 66a is used for coupling between the pad 14a and the coil 31a. The pad 66b is used for coupling between the pad 14b and the coil 31b. The pads 66a and 66b are formed of, for example, a conductive material.

The interconnects 67a and 67b are provided on the first surface P1 of the wiring board 30. One end of the interconnect 67a is coupled to the pad 66a. The other end of the interconnect 67a is coupled to the second end of the coil 31a. One end of the interconnect 67b is coupled to the pad 66b. The other end of the interconnect 67b is coupled to the second end of the coil 31b. The interconnect 67a couples electrically between the pad 66a and the second end of the coil 31a. The interconnect 67b couples electrically between the pad 66b and the second end of the coil 31b. The interconnects 67a and 67b are formed of, for example, a conductive material.

The wiring board 40 is, for example, FPC. The wiring board 40 is formed of, for example, an FPC material. The wiring board 40 is formed into, for example, a plate shape. The wiring board 40 is arranged with a space from the wiring board 30 in the X direction with the insulator 100 (not shown) intervening therebetween. The wiring board 40 includes a third surface and a fourth surface arranged side by side in the Z direction. The fourth surface faces the third surface. Hereinafter, of the surfaces of the wiring board 40, the one surface provided with the chip 20 will be referred to as a "third surface P3", and the other surface not provided with the chip 20 will be referred to as a "fourth surface P4". The wiring board 40 may be formed of, for example, a glass epoxy resin material or a Teflon material. The wiring board 40 has a thickness of, for example, about 25 μm.

The coils 41a and 41b are provided on the third surface P3 of the wiring board 40. The coils 41a and 41b each include, for example, a conductor wound in a spiral fashion along the XY plane. The coils 41a and 41b are each formed into, for example, a circular shape. The coils 41a and 41b include, for example, copper. The coils 41a and 41b have a thickness of, for example, 6 μm or greater and 12 μm or smaller. The coils 41a and 41b may be formed into, for example, a rectangular shape or a polygonal shape.

The conductors 80a and 80b are each, for example, a member for placing the chip 20 thereon. The conductors 80a and 80b are provided on the third surface P3 of the wiring board 40. The conductors 80a and 80b are each formed into, for example, a plate shape. The conductors 80a and 80b are formed of, for example, a conductive material. The conductors 80a and 80b are, for example, copper foil.

The attachment member 81a is provided on the conductor 80a. The attachment member 81b is provided on the conductor 80b. The attachment members 81a and 81b are formed of, for example, a conductive material. The attachment members 81a and 81b are, for example, silver paste.

The chip 20 is provided on the attachment members 81a and 81b. The chip 20 includes pads 23a, 23b, 24a, 24b, 25a, and 25b. The pads 23a, 23b, 24a, 24b, 25a, and 25b are, for example, electrode pads. The pads 23a, 23b, 24a, and 24b are provided on the upper surface of the chip 20. The pads 25a and 25b are provided on the lower surface of the chip 20. The pad 23a is used for coupling between the reception circuit 21a and the pad 83a. The pad 23b is used for coupling between the reception circuit 21b and the pad 83b. The pad 24a is used for coupling between the reception circuit 21a and the pad 86a. The pad 24b is used for coupling between the reception circuit 21b and the pad 86b. The pad 25a is used for coupling between the electronic circuit 22a and the attachment member 81a. The pad 25b is used for coupling between the electronic circuit 22b and the attachment member 81b. The pads 23a, 23b, 24a, 24b, 25a, and 25b are formed of, for example, a conductive material.

The interconnects 82a and 82b are, for example, bonding wire. One end of the interconnect 82a is coupled to the pad 23a. The other end of the interconnect 82a is coupled to the pad 83a. One end of the interconnect 82b is coupled to the pad 23b. The other end of the interconnect 82b is coupled to the pad 83b. The interconnect 82a couples electrically between the pad 23a and the pad 83a. The interconnect 82b couples electrically between the pad 23b and the pad 83b. The interconnects 82a and 82b are formed of, for example, a conductive material.

The pads 83a and 83b are, for example, electrode pads. The pads 83a and 83b are provided on the third surface P3 of the wiring board 40. The pad 83a is used for coupling between the pad 23a and the coil 41a. The pad 83b is used for coupling between the pad 23b and the coil 41b. The pads 83a and 83b are formed of, for example, a conductive material.

The interconnects 84a and 84b are provided on the third surface P3 of the wiring board 40. One end of the interconnect 84a is coupled to the pad 83a. The other end of the interconnect 84a is coupled to the first end of the coil 41a. One end of the interconnect 84b is coupled to the pad 83b. The other end of the interconnect 84b is coupled to the first end of the coil 41b. The interconnect 84a couples electrically between the pad 83a and the first end of the coil 41a. The interconnect 84b couples electrically between the pad 83b and the first end of the coil 41b. The interconnects 84a and 84b are formed of, for example, a conductive material.

The interconnects 85a and 85b are, for example, bonding wire. One end of the interconnect 85a is coupled to the pad 24a. The other end of the interconnect 85a is coupled to the pad 86a. One end of the interconnect 85b is coupled to the pad 24b. The other end of the interconnect 85b is coupled to the pad 86b. The interconnect 85a couples electrically between the pad 24a and the pad 86a. The interconnect 85b couples electrically between the pad 24b and the pad 86b. The interconnects 85a and 85b are formed of, for example, a conductive material.

The pads 86a and 86b are, for example, electrode pads. The pads 86a and 86b are provided on the third surface P3 of the wiring board 40. The pad 86a is used for coupling between the pad 24a and the coil 41a. The pad 86b is used for coupling between the pad 24b and the coil 41b. The pads 86a and 86b are formed of, for example, a conductive material.

The interconnects 87a and 87b are provided on the third surface P3 of the wiring board 40. One end of the interconnect 87a is coupled to the pad 86a. The other end of the interconnect 87a is coupled to the second end of the coil 41a. One end of the interconnect 87b is coupled to the pad 86b. The other end of the interconnect 87b is coupled to the second end of the coil 41b. The interconnect 87a couples electrically between the pad 86a and the second end of the coil 41a. The interconnect 87b couples electrically between the pad 86b and the second end of the coil 41b. The interconnects 87a and 87b are each formed of, for example, a conductive material.

Figure 3:
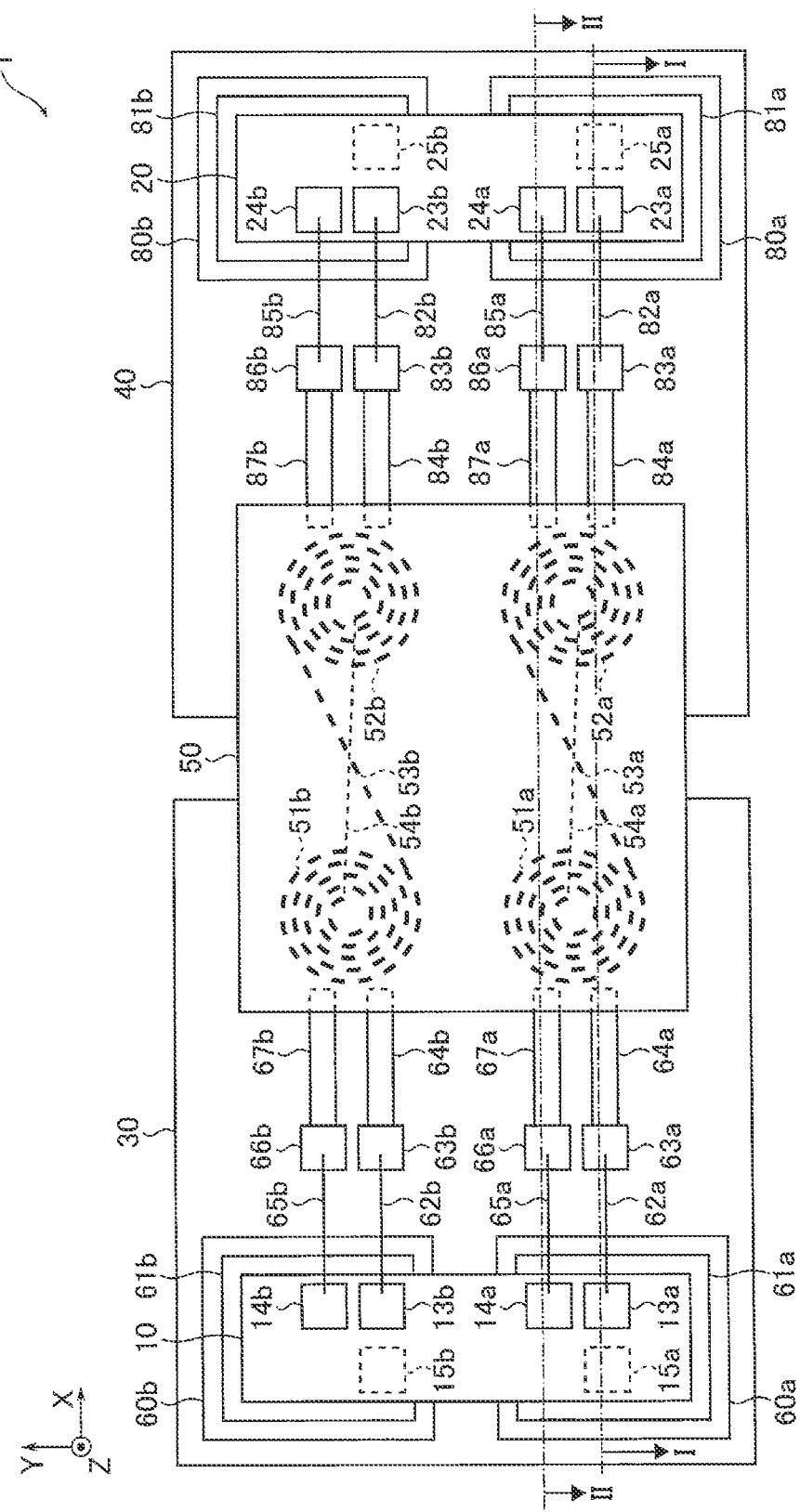
FIG. 3 is a plan view showing an example of a planar structure of the isolator according to the first embodiment.

FIG. 3 is a plan view showing an example of a planar structure of the isolator 1. FIG. 3 omits the external electrode terminals T1a, T1b, T2a, and T2b, the coils 31a, 31b, 41a, and 41b, the vias 68a, 68b, 88a, and 88b, the insulator 100, and the resin 110.

As shown in FIG. 3, the wiring board 50 is, for example, FPC. The wiring board 50 is formed of, for example, an FPC material. The wiring board 50 is formed into, for example, a plate shape. The wiring board 50 is arranged with a space from each of the wiring boards 30 and 40 in the Z direction via the insulator 100 (not shown). The wiring board 50 includes a fifth surface and a sixth surface arranged side by side in the Z direction. The sixth surface faces the fifth surface. The sixth surface faces the first surface P1 of the wiring board 30 and the third surface P3 of the wiring board 40. Hereinafter, of the surfaces of the wiring board 50, the one surface opposite to the wiring boards 30 and 40 will be referred to as a "fifth surface P5", and the other surface close to the wiring boards 30 and 40 will be referred to as a "sixth surface P6". The wiring board 50 may be formed of, for example, a glass epoxy resin material or a Teflon material. The wiring board 50 has a thickness of, for example, about 25 μm.

The coils 51a, 51b, 52a, and 52b are provided on the sixth surface P6 of the wiring board 50. The coil 51a faces the coil 31a. The coil 51b faces the coil 31b. The coil 52a faces the coil 41a. The coil 52b faces the coil 41b. The coils 51a, 51b, 52a, and 52b each include, for example, a conductor wound in a spiral fashion along the XY plane. The coils 51a, 51b, 52a, and 52b are each formed into, for example, a circular shape. The coils 51a, 51b, 52a, and 52b include, for example, copper. The coils 51a, 51b, 52a, and 52b have a thickness of, for example, 6 μm or greater and 12 μm or smaller. The coils 51a, 51b, 52a, and 52b may be each formed into, for example, a rectangular shape or a polygonal shape.

The interconnects 53a and 53b are provided on the sixth surface P6 of the wiring board 50. One end of the interconnect 53a is coupled to the first end of the coil 51a. The other end of the interconnect 53a is coupled to the first end of the coil 52a. One end of the interconnect 53b is coupled to the first end of the coil 51b. The other end of the interconnect 53b is coupled to the first end of the coil 52b. The interconnect 53a couples electrically between the first end of the coil 51a and the first end of the coil 52a. The interconnect 53b couples electrically between the first end of the coil 51b and the first end of the coil 52b. The interconnects 53a and 53b are each formed of, for example, a conductive material.

The interconnects 54a and 54b are, for example, bonding wire. One end of the interconnect 54a is coupled to the second end of the coil 51a. The other end of the interconnect 54a is coupled to the second end of the coil 52a. One end of the interconnect 54b is coupled to the second end of the coil 51b. The other end of the interconnect 54b is coupled to the second end of the coil 52b. The interconnect 54a couples electrically between the second end of the coil 51a and the second end of the coil 52a. The interconnect 54b couples electrically between the second end of the coil 51b and the second end of the coil 52b. The interconnects 54a and 54b are each formed of, for example, a conductive material.

The coil 52a is electrically coupled to the coil 51a with the interconnects 53a and 54a intervening therebetween. The coil 52b is electrically coupled to the coil 51b with the interconnects 53b and 54b intervening therebetween.

Figure 4:
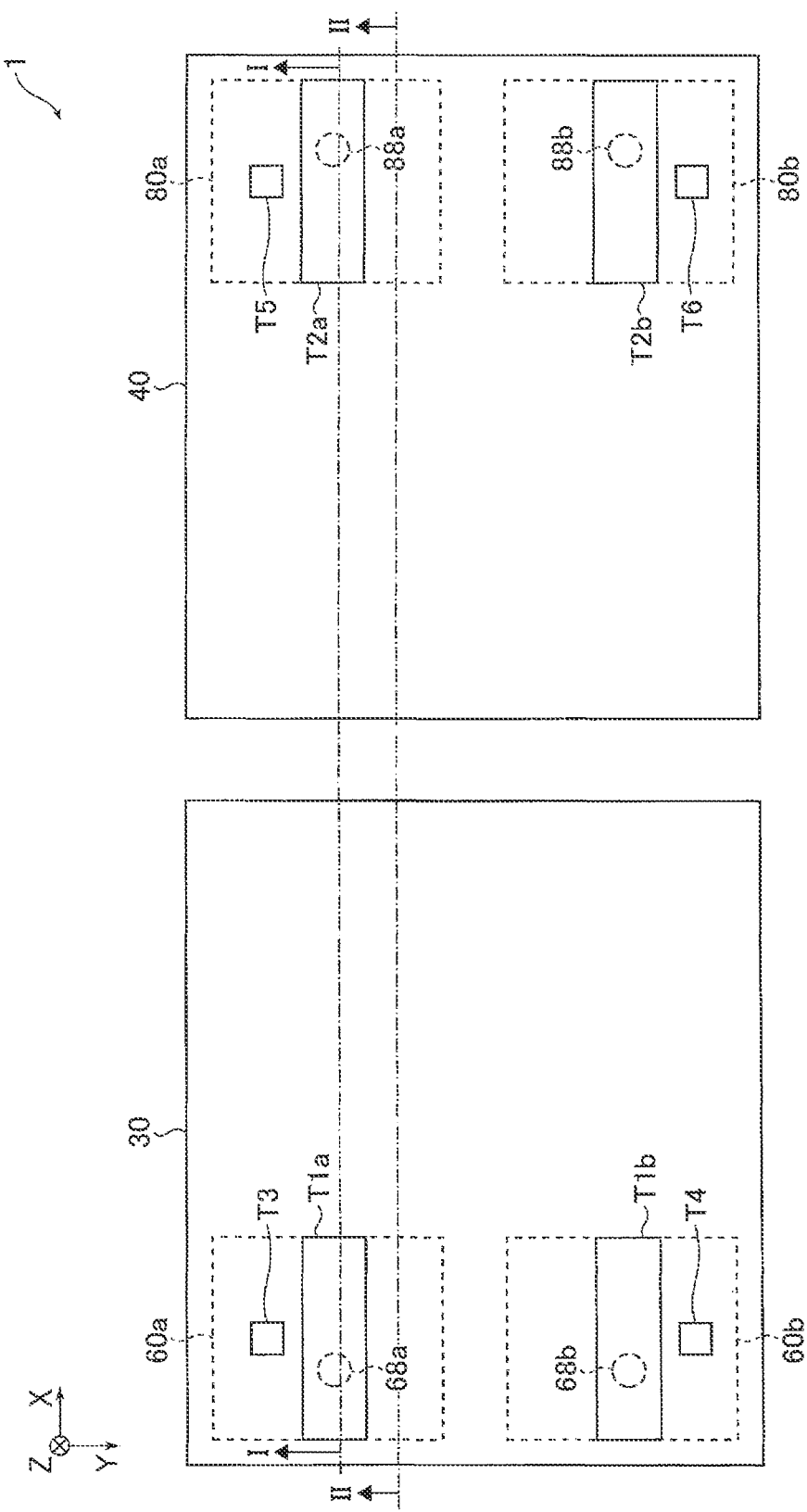
FIG. 4 is a plan view showing an example of a planar structure of the isolator according to the first embodiment.

FIG. 4 is a plan view showing an example of a planar structure of the isolator 1. FIG. 4 is a plan view of the isolator 1 as viewed from the second surface P2 side of the wiring board 30 and the fourth surface P4 side of the wiring board 40. FIG. 4 omits the chips 10 and 20, the coils 31a, 31b, 41a, and 41b, the wiring board 50, the coils 51a, 51b, 52a, and 52b, the interconnects 53a, 53b, 54a, and 54b, the attachment members 61a and 61b, the interconnects 62a and 62b, the pads 63a and 63b, the interconnects 64a, 64b, 65a, and 65b, the pads 66a and 66b, the interconnects 67a and 67b, the attachment members 81a and 81b, the interconnects 82a and 82b, the pads 83a and 83b, the interconnects 84a, 84b, 85a, and 85b, the pads 86a and 86b, the interconnects 87a and 87b, the insulator 100, and the resin 110.

As shown in FIG. 4, the external electrode terminals T1a and T1b are provided on the second surface P2 of the wiring board 30. The external electrode terminals T1a and T1b are formed of, for example, a conductive material. The external electrode terminals T1a and T1b are, for example, copper foil.

The vias 68a and 68b are, for example, through vias. The vias 68a and 68b penetrate the wiring board 30. One end of the via 68a is coupled to the conductor 60a. The other end of the via 68a is coupled to the external electrode terminal T1a. One end of the via 68b is coupled to the conductor 60b. The other end of the via 68b is coupled to the external electrode terminal T1b. The via 68a couples electrically between the conductor 60a and the external electrode terminal T1a. The via 68b couples electrically between the conductor 60b and the external electrode terminal T1b. The vias 68a and 68b are each formed of, for example, a conductive material. The vias 68a and 68b are, for example, copper foil.

The external electrode terminals T2a and T2b are provided on the fourth surface P4 of the wiring board 40. The external electrode terminals T2a and T2b are formed of, for example, a conductive material. The external electrode terminals T2a and T2b are, for example, copper foil.

The vias 88a and 88b are, for example, through vias. The vias 88a and 88b penetrate the wiring board 40. One end of the via 88a is coupled to the conductor 80a. The other end of the via 88a is coupled to the external electrode terminal T2a. One end of the via 88b is coupled to the conductor 80b. The other end of the via 88b is coupled to the external electrode terminal T2b. The via 88a couples electrically between the conductor 80a and the external electrode terminal T2a. The via 88b couples electrically between the conductor 80b and the external electrode terminal T2b. The vias 88a and 88b are each formed of, for example, a conductive material. The vias 88a and 88b are, for example, copper foil.

A power supply voltage terminal T3 is provided on the second surface P2 of the wiring board 30. The power supply voltage VDD is supplied to the chip 10 via the power supply voltage terminal T3. The power supply voltage terminal T3 is formed of, for example, a conductive material.

A ground voltage terminal T4 is provided on the second surface P2 of the wiring board 30. The ground voltage VSS is supplied to the chip 10 via the ground voltage terminal T4. The ground voltage terminal T4 is formed of, for example, a conductive material.

A power supply voltage terminal T5 is provided on the fourth surface P4 of the wiring board 40. The power supply voltage VDD is supplied to the chip 20 via the power supply voltage terminal T5. The power supply voltage terminal T5 is formed of, for example, a conductive material.

A ground voltage terminal T6 is provided on the fourth surface P4 of the wiring board 40. The ground voltage VSS is supplied to the chip 20 via the ground voltage terminal T6. The ground voltage terminal T6 is formed of, for example, a conductive material.

(Cross-Sectional Structure)

Figure 5:
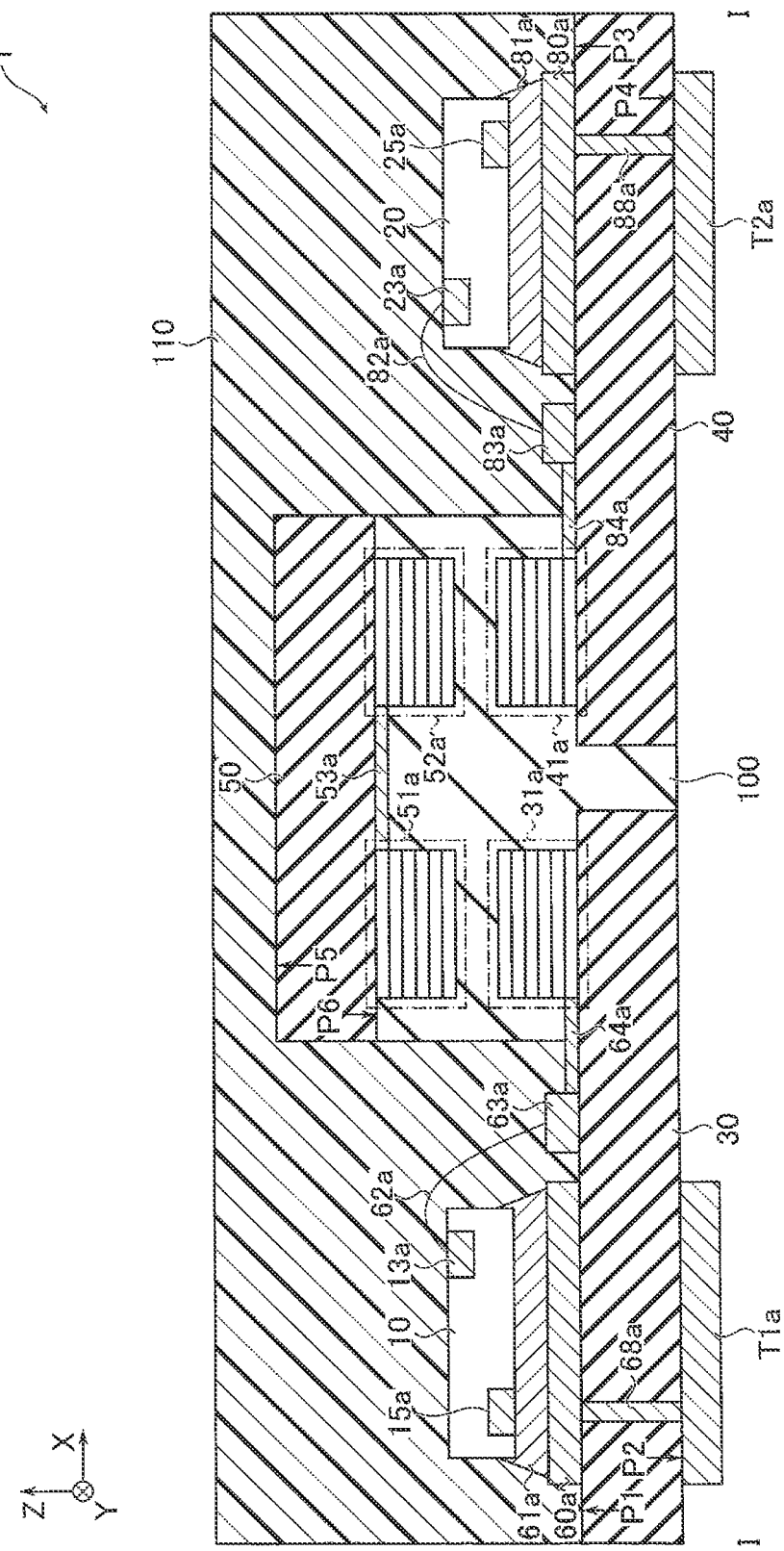
FIG. 5 is a sectional view showing an example of a sectional structure of the isolator according to the first embodiment.

FIG. 5 is a sectional view showing an example of a sectional structure of the isolator 1. FIG. 5 is a sectional view taken along the line I-I shown in FIG. 2 to FIG. 4.

As shown in FIG. 5, the via 68a is provided inside the wiring board 30. The via 68a extends in the Z direction and penetrates the wiring board 30.

The external electrode terminal T1a is provided on the second surface P2 of the wiring board 30 (a surface opposite to the wiring board 50). The external electrode terminal T1a is in contact with the via 68a.

The coil 31a, the conductor 60a, the pad 63a, and the interconnect 64a are provided on the first surface P1 of the wiring board 30 (a surface close to the wiring board 50). The conductor 60a is in contact with the via 68a. The attachment member 61a is provided on the conductor 60a. The chip 10 is provided on the attachment member 61a. The pad 15a of the chip 10 is in contact with the attachment member 61a. The pad 13a of the chip 10 is electrically coupled to the first end of the coil 31a with the interconnect 62a, the pad 63a, and the interconnect 64a intervening therebetween. In other words, the coil 31a is electrically coupled to the chip 10. The pad 15a of the chip 10 is electrically coupled to the external electrode terminal T1a with the attachment member 61a, the conductor 60a, and the via 68a intervening therebetween.

The chip 10 is provided on the first surface P1 of the wiring board 30 facing in the Z direction.

The via 88a is provided inside the wiring board 40. The via 88a extends in the Z direction and penetrates the wiring board 40.

The external electrode terminal T2a is provided on the fourth surface P4 of the wiring board 40 (a surface opposite to the wiring board 50). The external electrode terminal T2a is in contact with the via 88a.

The coil 41a, the conductor 80a, the pad 83a, and the interconnect 84a are provided on the third surface P3 of the wiring board 40 (a surface close to the wiring board 50). The conductor 80a is in contact with the via 88a. The attachment member 81a is provided on the conductor 80a. The chip 20 is provided on the attachment member 81a. The pad 25a of the chip 20 is in contact with the attachment member 81a. The pad 23a of the chip 20 is electrically coupled to the first end of the coil 41a with the interconnect 82a, the pad 83a, and the interconnect 84a intervening therebetween. In other words, the coil 41a is electrically coupled to the chip 20. The pad 25a of the chip 20 is electrically coupled to the external electrode terminal T2a with the attachment member 81a, the conductor 80a, and the via 88a intervening therebetween.

The chip 20 is provided on the third surface P3 of the wiring board 40 facing in the Z direction.

The coils 51a and 52a and the interconnect 53a are provided on the sixth surface P6 of the wiring board 50.

The first end of the coil 51a is electrically coupled to the first end of the coil 52a with the interconnect 53a intervening therebetween.

The insulator 100 is provided between the wiring boards 30 and 40, between the wiring boards 30 and 50, and between the wiring boards 40 and 50. In other words, the insulator 100 is provided between the coil 31a and the coil 41a. The insulator 100 is provided between the coil 31a and the coil 51a. The insulator 100 is provided between the coil 41a and the coil 52a. The insulator 100 is provided between the coil 51a and the coil 52a. An interval between the coil 31a and the coil 51a is determined by, for example, a coefficient of magnetic coupling between the coil 31a and the coil 51a and a dielectric strength voltage of the insulator 100. An interval between the coil 41a and the coil 52a is determined by, for example, a coefficient of magnetic coupling between the coil 41a and the coil 52a and a dielectric strength voltage of the insulator 100. Based on this, magnetic coupling via the coil 31a and the coil 51a and magnetic coupling via the coils 41a and the coil 52a are realized while the coils 31a, 41a, 51a, and 52a are insulated from each other. Part of the first surface P1 of the wiring board 30, a surface, which faces the wiring board 40, of the wiring board 30, part of the third surface P3 of the wiring board 40, a surface, which faces the wiring board 30, of the wiring board 40, part of the sixth surface P6 of the wiring board 50, the coils 31a, 41a, 51a, and 52a, the interconnect 53a, part of the interconnect 64a, and part of the interconnect 84a are covered with the insulator 100. The insulator 100 is formed of, for example, an insulating material.

The first surface P1 of the wiring board 30, the conductor 60a, the attachment member 61a, the chip 10, the interconnect 62a, the pad 63a, the interconnect 64a, the third surface P3 of the wiring board 40, the conductor 80a, the attachment member 81a, the chip 20, the interconnect 82a, the pad 83a, the interconnect 84a, the wiring board 50, and the insulator 100 are covered with the resin 110. The resin 110 is, for example, epoxy resin.

Figure 6:
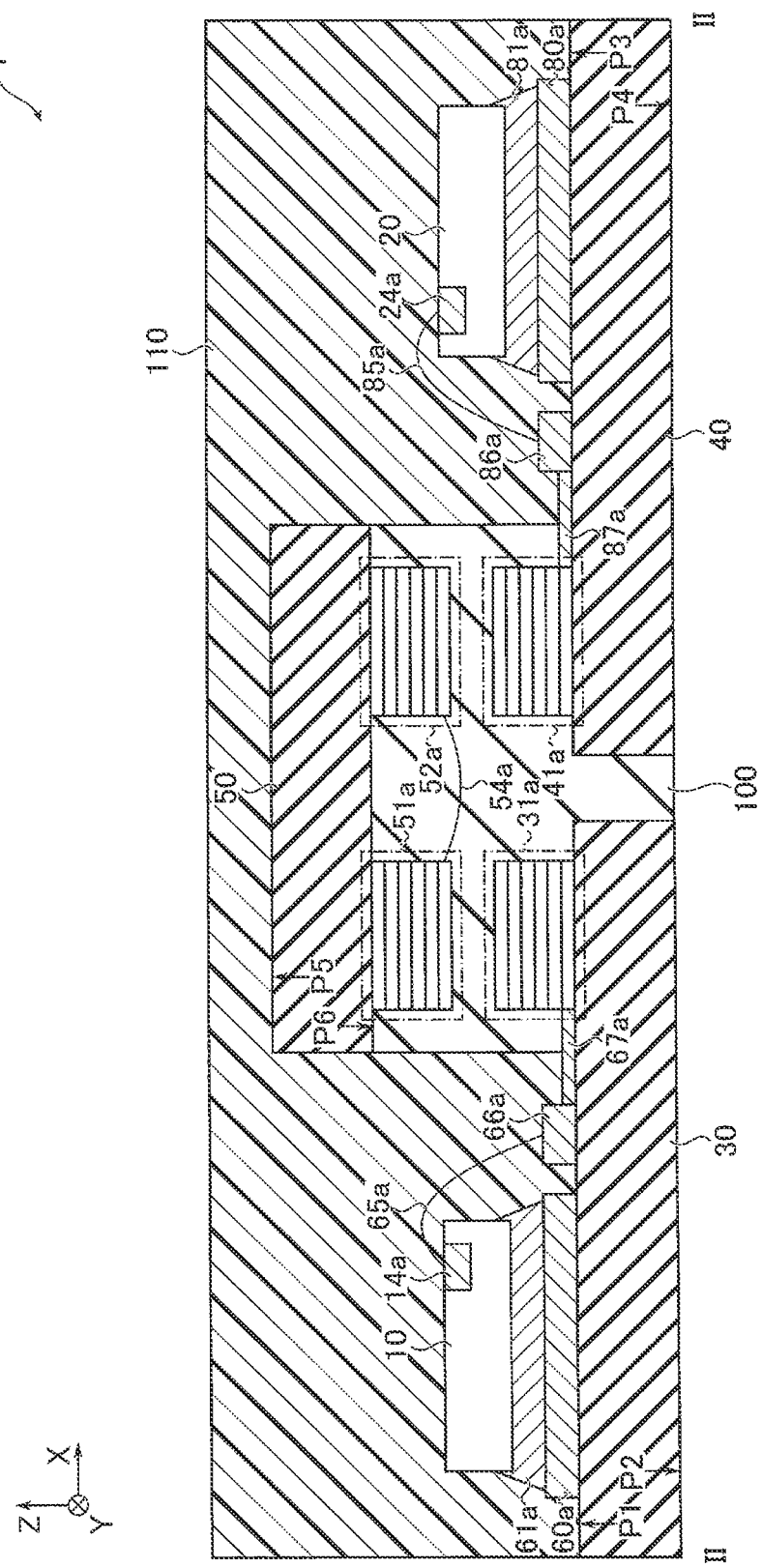
FIG. 6 is a sectional view showing an example of a sectional structure of the isolator according to the first embodiment.

FIG. 6 is a sectional view showing an example of a sectional structure of the isolator 1. FIG. 6 is a sectional view taken along the line II-II shown in FIG. 2 to FIG. 4.

As shown in FIG. 6, the pad 66a and the interconnect 67a are provided on the first surface P1 of the wiring board 30. The pad 14a of the chip 10 is electrically coupled to the second end of the coil 31a with the interconnect 65a, the pad 66a, and the interconnect 67a intervening therebetween.

The pad 86a and the interconnect 87a are provided on the third surface P3 of the wiring board 40. The pad 24a of the chip 20 is electrically coupled to the second end of the coil 41a with the interconnect 85a, the pad 86a, and the interconnect 87a intervening therebetween.

The second end of the coil 51a is electrically coupled to the second end of the coil 52a with the interconnect 54a intervening therebetween.

The interconnect 54a, part of the interconnect 67a, and part of the interconnect 87a are covered with the insulator 100.

The interconnect 65a, the pad 66a, the interconnect 67a, the interconnect 85a, the pad 86a, and the interconnect 87a are covered with the resin 110.

The structure described above is the sectional structure of the first transmission circuit TCa of the isolator 1. The sectional structure of the second transmission circuit TCb of the isolator 1 is similar to the sectional structure of the first transmission circuit TCa.

1.3 Operation of Isolator

An operation of the isolator 1 will be described with reference to FIG. 1. Hereinafter, an operation during signal transmission between the transmission circuit 12a and the reception circuit 21a in the first transmission circuit TCa will be described.

As shown in FIG. 1, when the non-inversion signal S3pa is input from the reception circuit 12a to the first end of the coil 31a and the inversion signal S3ma is input from the transmission circuit 12a to the second end of the coil 31a, the current I1a flows through the coil 31a based on the signals S3pa and S3ma. The orientation of the current I1a flowing through the coil 31a corresponds to, for example, the direction going from the first end to the second end of the coil 31a. This generates a magnetic field H1a in an upward direction (a direction going from the coil 31a to the coil 51a) in the coil 31a. Upon generation of the upward magnetic field H1a in the coil 31a, a magnetic flux that penetrates the coil 51a is varied. This causes the current I2a (inductive current) to flow through the coil 51a. The orientation of the current I2a flowing through the coil 51a corresponds to, for example, the direction going from the second end to the first end of the coil 51a.

When the current I2a flows through the coil 51a, it also flows through the coil 52a. The orientation of the current I2a flowing through the coil 52a corresponds to, for example, the direction going from the first end to the second end of the coil 52a. This generates a magnetic field H2a in a downward direction (a direction going from the coil 52a to the coil 41a) in the coil 52a. Upon generation of the downward magnetic field H2a in the coil 52a, a magnetic flux that penetrates the coil 41a is varied. This causes the current I3a (inductive current) to flow through the coil 41a. The orientation of the current I3a flowing through the coil 41a corresponds to, for example, the direction going from the second end to the first end of the coil 41a.

When the current I3a flows through the coil 41a, based on the current I3a, the non-inversion signal S4pa is input from the second end of the coil 41a to the reception circuit 21a while the inversion signal S4ma is input from the first end of the coil 41a to the reception circuit 21a.

In this manner, the isolator 1 (first transmission circuit TCa) receives a signal (electric signal) from the chip 10 (transmission circuit 12a) and converts the received signal into a magnetic energy via the coil 31a. The isolator 1 converts the magnetic energy into a signal (electric signal) again via the coils 51a, 52a, and 41a, and transmits the converted signal to the chip 20 (reception circuit 21a). Thereby, the isolator 1 transmits a signal from the chip 10 to the chip 20 in a state in which the chip 10 and the chip 20 are insulated.

The operation of the second transmission circuit TCb in the isolator 1 is similar to the operation of the first transmission circuit TCa.

The isolator 1 according to the present embodiment enables size reduction of a semiconductor package.

A semiconductor chip on a transmission side provided with a coil for magnetic coupling and a semiconductor chip on a reception side provided with a coil for magnetic coupling are larger in size than such semiconductor chips without coils. For this reason, the isolator 1 in which a semiconductor chip provided with a coil is arranged may be larger in size than the isolator 1 in which a semiconductor chip 1 with no coil is arranged.

In this respect, in the present embodiment, the coils 31a and 31b are provided on the first surface P1 of the wiring board 30. The coils 41a and 41b are provided on the third surface P3 of the wiring board 40. The coils 51a, 51b, 52a, and 52b are provided on the sixth surface P6 of the wiring board 50. In this manner, the present embodiment enables the chips 10 and 20 to be reduced in size, as compared to a case in which, for example, the coils 31a, 31b, 51a, and 51b are provided on the chip 10 and the coils 41a, 41b, 52a, and 52b are provided on the chip 20. Thus, the cost of chips 10 and 20 can be reduced.

Furthermore, in the present embodiment, the wiring boards 30, 40, and 50 having a relatively small thickness are used as members in which a chip, a coil, an interconnect, etc., are arranged. Therefore, the present embodiment can reduce a size of the isolator 1 as compared to a case in which a lead frame is used as a member in which a chip, a coil, an interconnect, etc., are arranged.

In addition, in the present embodiment, the external electrode terminals T1a and T1b are provided on the second surface P2 of the wiring board 30. The external electrode terminals T2a and T2b are provided on the fourth surface P4 of the wiring board 40. Therefore, the present embodiment enables size reduction of the isolator 1 as compared to a case in which an upper surface side and a lower surface side of a lead frame are covered with a resin and the lead frame is led out as an external electrode terminal.

1.4 First Modification

An isolator according to a first modification of the first embodiment will be described. The isolator 1 according to the first modification of the first embodiment differs from that of the first embodiment in that the coils 31a, 31b, 41a, 41b, 51a, 51b, 52a, and 52b are covered with a resin. The following will omit a description of a configuration similar to that of the first embodiment and will mainly provide a description of a configuration different from that of the first embodiment.

1.4.1 Structure of Isolator

A structure of the isolator 1 will be described.

The planer structure of the isolator 1 is similar to those shown in FIG. 2 to FIG. 4 described in the first embodiment.

Figure 7:
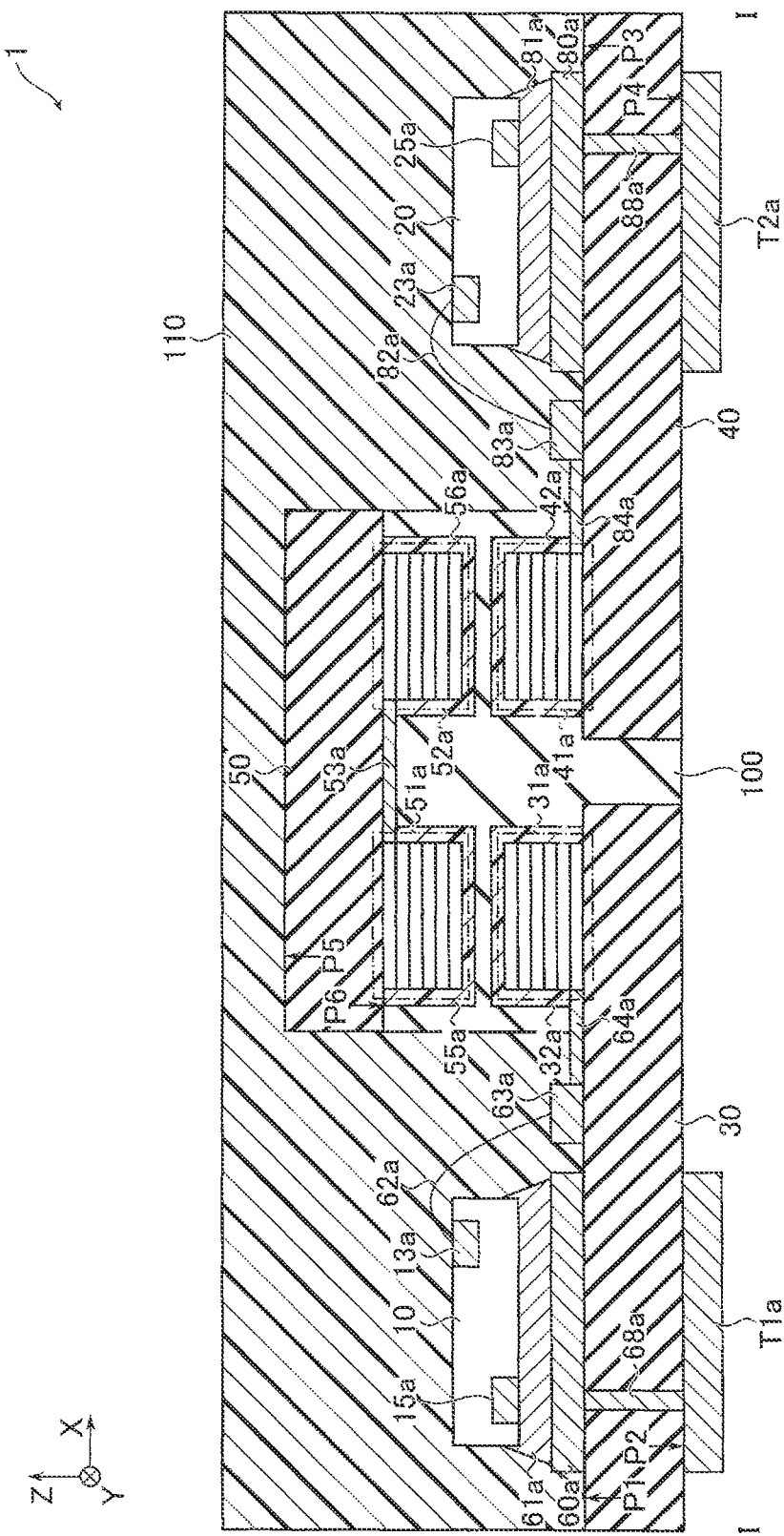
FIG. 7 is a sectional view showing an example of a sectional structure of an isolator according to a first modification of the first embodiment.

FIG. 7 is a sectional view showing an example of a sectional structure of the isolator 1. FIG. 7 is a sectional view taken along the line I-I shown in FIG. 2 to FIG. 4.

As shown in FIG. 7, the remaining part of the coil 31a excluding its first end coupled to the interconnect 64a is covered with a resin 32a. The remaining part of the coil 41a excluding its first end coupled to the interconnect 84a is covered with a resin 42a. The remaining part of the coil 51a excluding its first end coupled to the interconnect 53a is covered with a resin 55a. The remaining part of the coil 52a excluding its first end coupled to the interconnect 53a is covered with a resin 56a. The resins 32a, 42a, 55a, and 56a are, for example, a polyimide resin.

An interval between the coil 31a and the coil 51a is determined by, for example, a coefficient of magnetic coupling between the coil 31a and the coil 51a and a dielectric strength voltage of the insulator 100 and the resins 32a and 55a. An interval between the coil 41a and the coil 52a is determined by, for example, a coefficient of magnetic coupling between the coil 41a and the coil 52a and a dielectric strength voltage of the insulator 100 and the resins 42a and 56a.

The resins 32a, 42a, 55a, and 56a are covered with the insulator 100. In other words, the resin 32a is provided between the coil 31a and the insulator 100. The resin 42a is provided between the coil 41a and the insulator 100. The resin 55a is provided between the coil 51a and the insulator 100. The resin 56a is provided between the coil 52a and the insulator 100.

The remaining part of the sectional structure of the isolator 1 shown in FIG. 7 is similar to that of FIG. 5 described in the first embodiment.

Figure 8:
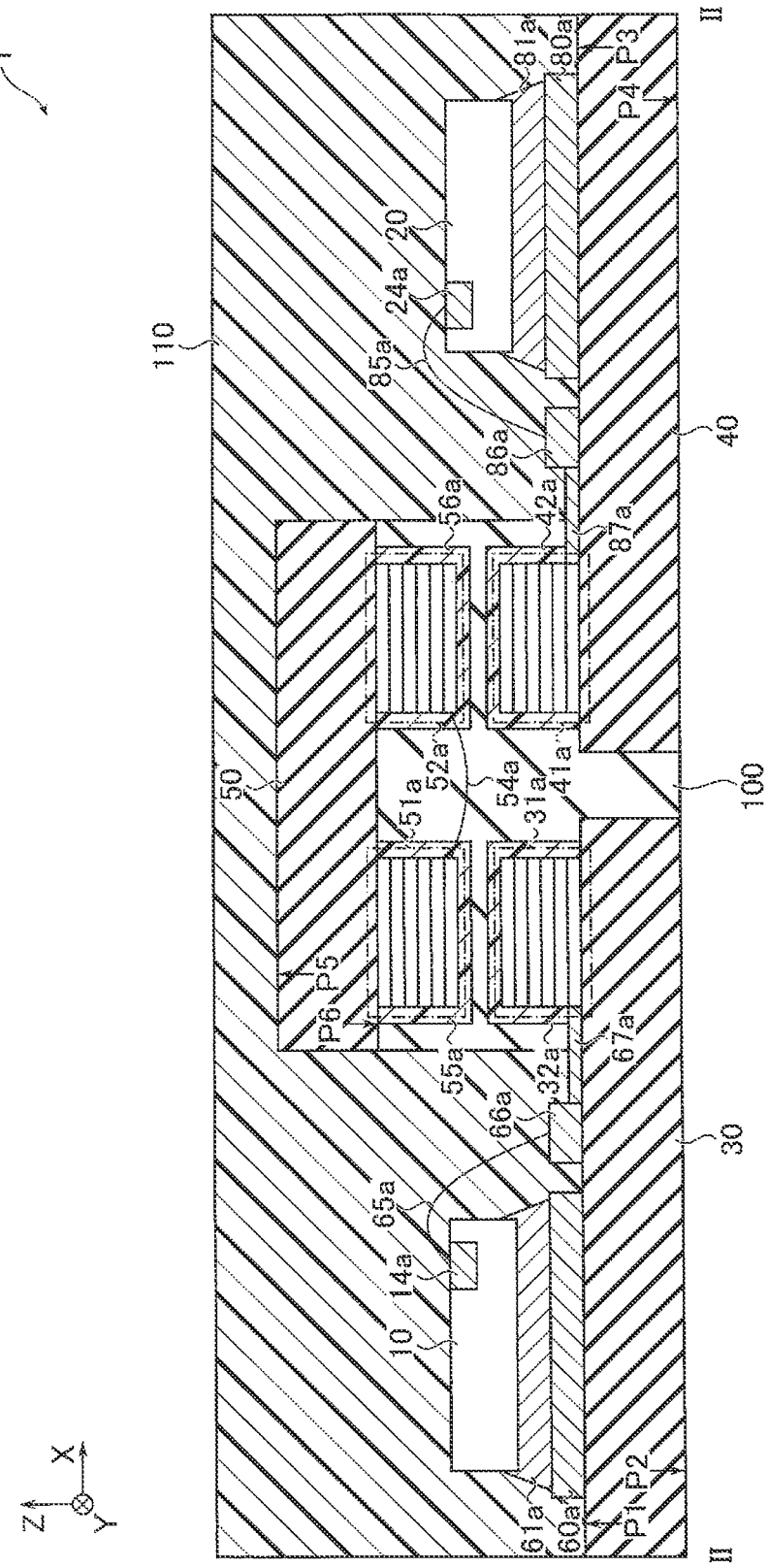
FIG. 8 is a sectional view showing an example of a sectional structure of the isolator according to the first modification of the first embodiment.

FIG. 8 is a sectional view showing an example of a sectional structure of the isolator 1. FIG. 8 is a sectional view taken along the line II-II shown in FIG. 2 to FIG. 4.

As shown in FIG. 8, the remaining part of the coil 31a excluding its second end coupled to the interconnect 67a is covered with the resin 32a. The remaining part of the coil 41a excluding its second end coupled to the interconnect 87a is covered with a resin 42a. The remaining part of the coil 51a excluding its second end coupled to the interconnect 54a is covered with the resin 55a. The remaining part of the coil 52a excluding its second end coupled to the interconnect 54a is covered with a resin 56a.

The remaining part of the sectional structure of the isolator 1 shown in FIG. 8 is similar to that of FIG. 6 described in the first embodiment.

The structure described above is the sectional structure of the first transmission circuit TCa of the isolator 1. The sectional structure of the second transmission circuit TCb of the isolator 1 is similar to the sectional structure of the first transmission circuit TCa. That is, the coils 31b, 41b, 51b, and 52b are covered with resins 32b, 42b, 55b, and 56b (not shown).

As with the first embodiment, in the present modification, the coils 31a, 31b, 51a, and 51b are not provided on the chip 10, and the coils 41a, 41b, 52a, and 52b are not provided on the chip 20. Furthermore, as with the first embodiment, in the present modification, the wiring boards 30, 40, and 50 are used as members in which a chip, a coil, an interconnect, etc., are arranged. In addition, as with the first embodiment, in the present modification, the external electrode terminals T1a and T1b are provided on the second surface P2 of the wiring board 30, and the external electrode terminals T2a and T2b are provided on the fourth surface P4 of the wiring board 40. Therefore, the present modification enables size reduction of a semiconductor package.

1.5 Second Modification

An isolator according to a second modification of the first embodiment will be described. The isolator 1 according to the second modification of the first embodiment differs from that of the first embodiment in that the coils 31a and 31b are provided inside the wiring board 30, the coils 41a and 41b are provided inside the wiring board 40, and the coils 51, 51b, 52a, and 52b are provided inside the wiring board 50. The following will omit a description of a configuration similar to that of the first embodiment and will mainly provide a description of a configuration different from that of the first embodiment.

1.5.1 Structure of Isolator

A structure of the isolator 1 will be described.
(Planar Structure)

Figure 9:
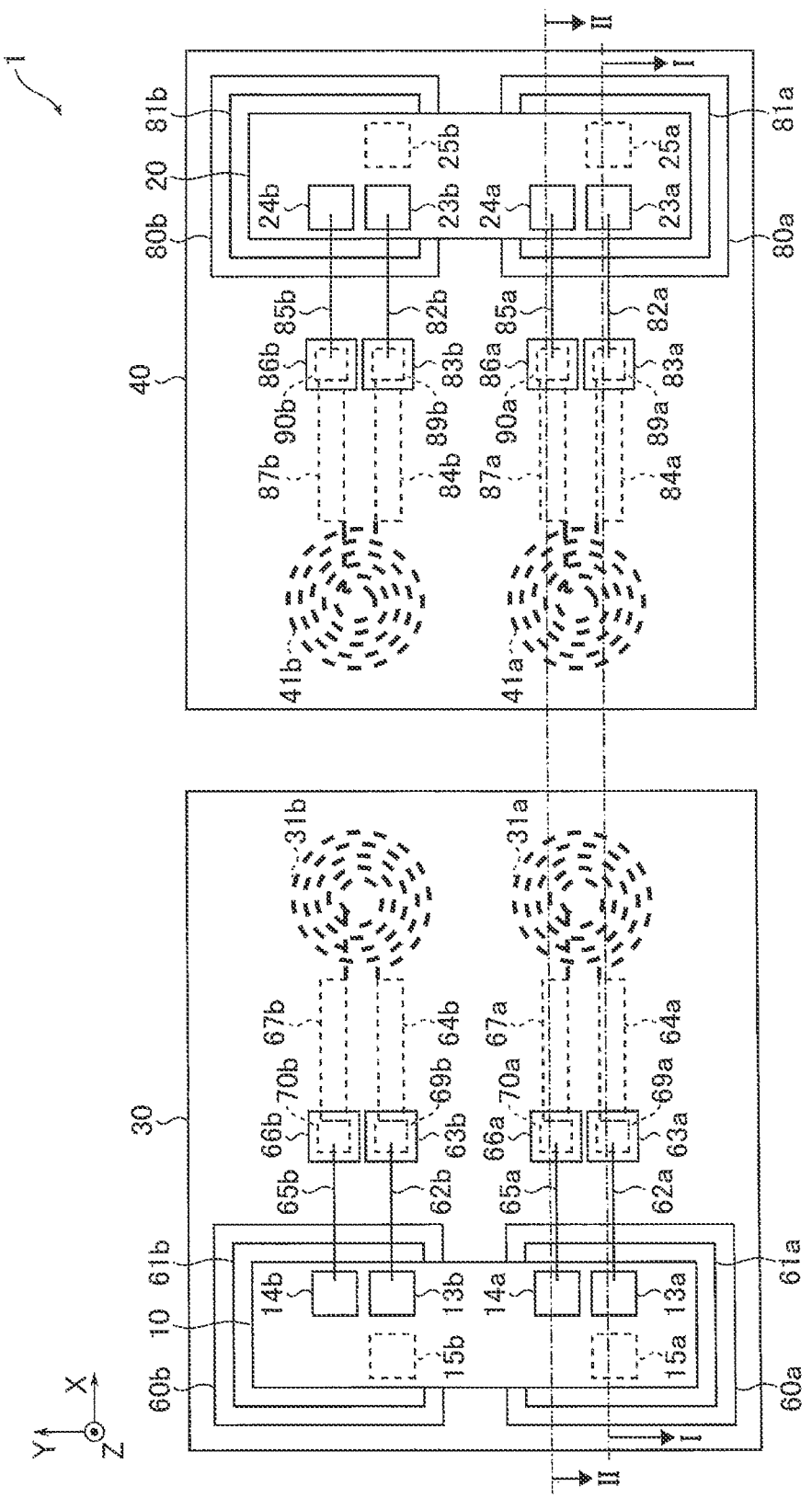
FIG. 9 is a plan view showing an example of a planar structure of an isolator according to a second modification of the first embodiment.

FIG. 9 is a plan view showing an example of a planar structure of the isolator 1.

In addition to the constituent elements described in the first embodiment, the isolator 1 further includes interconnects 69a, 69b, 70a, 70b, 89a, 89b, 90a, and 90b. FIG. 9 omits the external electrode terminals T1a, T1b, T2a, and T2b, the wiring board 50, the coils 51a, 51b, 52a, and 52b, the interconnects 53a, 53b, 54a, and 54b, vias 68a, 68b, 88a, and 88b, the insulator 100, and the resin 110.

As shown in FIG. 9, the coils 31a and 31b and the interconnects 64a, 64b, 67a, 67b, 69a, 69b, 70a, and 70b are provided inside the wiring board 30.

One end of the interconnect 64a is coupled to one end of the interconnect 69a. The other end of the interconnect 64a is coupled to the first end of the coil 31a. One end of the interconnect 64b is coupled to one end of the interconnect 69b. The other end of the interconnect 64b is coupled to the first end of the coil 31b.

One end of the interconnect 67a is coupled to one end of the interconnect 70a. The other end of the interconnect 67a is coupled to the second end of the coil 31a. One end of the interconnect 67b is coupled to one end of the interconnect 70b. The other end of the interconnect 67b is coupled to the second end of the coil 31b.

The other end of the interconnect 69a is coupled to the pad 63a. The other end of the interconnect 69b is coupled to the pad 63b. The interconnect 69a couples electrically between the pad 63a and the first end of the coil 31a with the interconnect 64a intervening therebetween. The interconnect 69b couples electrically between the pad 63b and the first end of the coil 31b with the interconnect 64b intervening therebetween. The interconnects 69a and 69b are each formed of, for example, a conductive material.

The other end of the interconnect 70a is coupled to the pad 66a. The other end of the interconnect 70b is coupled to the pad 66b. The interconnect 70a couples electrically between the pad 66a and the second end of the coil 31a with the interconnect 67a intervening therebetween. The interconnect 70b couples electrically between the pad 66b and the second end of the coil 31b with the interconnect 67b intervening therebetween. The interconnects 70a and 70b are each formed of, for example, a conductive material.

The coils 41a and 41b and the interconnects 84a, 84b, 87a, 87b, 89a, 89b, 90a, and 90b are provided inside the wiring board 40.

One end of the interconnect 84a is coupled to one end of the interconnect 89a. The other end of the interconnect 84a is coupled to the first end of the coil 41a. One end of the interconnect 84b is coupled to one end of the interconnect 89b. The other end of the interconnect 84b is coupled to the first end of the coil 41b.

One end of the interconnect 87a is coupled to one end of the interconnect 90a. The other end of the interconnect 87a is coupled to the second end of the coil 41a. One end of the interconnect 87b is coupled to one end of the interconnect 90b. The other end of the interconnect 87b is coupled to the second end of the coil 41b.

The other end of the interconnect 89a is coupled to the pad 83a. The other end of the interconnect 89b is coupled to the pad 83b. The interconnect 89a couples electrically between the pad 83a and the first end of the coil 41a with the interconnect 84a intervening therebetween. The interconnect 89b couples electrically between the pad 83b and the first end of the coil 41b with the interconnect 84b intervening therebetween. The interconnects 89a and 89b are each formed of, for example, a conductive material.

The other end of the interconnect 90a is coupled to the pad 86a. The other end of the interconnect 90b is coupled to the pad 86b. The interconnect 90a couples electrically between the pad 86a and the second end of the coil 41a with the interconnect 87a intervening therebetween. The interconnect 90b couples electrically between the pad 86b and the second end of the coil 41b with the interconnect 87b intervening therebetween. The interconnects 90a and 90b are each formed of, for example, a conductive material.

The remaining part of the planer structure of the isolator 1 shown in FIG. 9 is similar to that of FIG. 2 described in the first embodiment.

Figure 10:
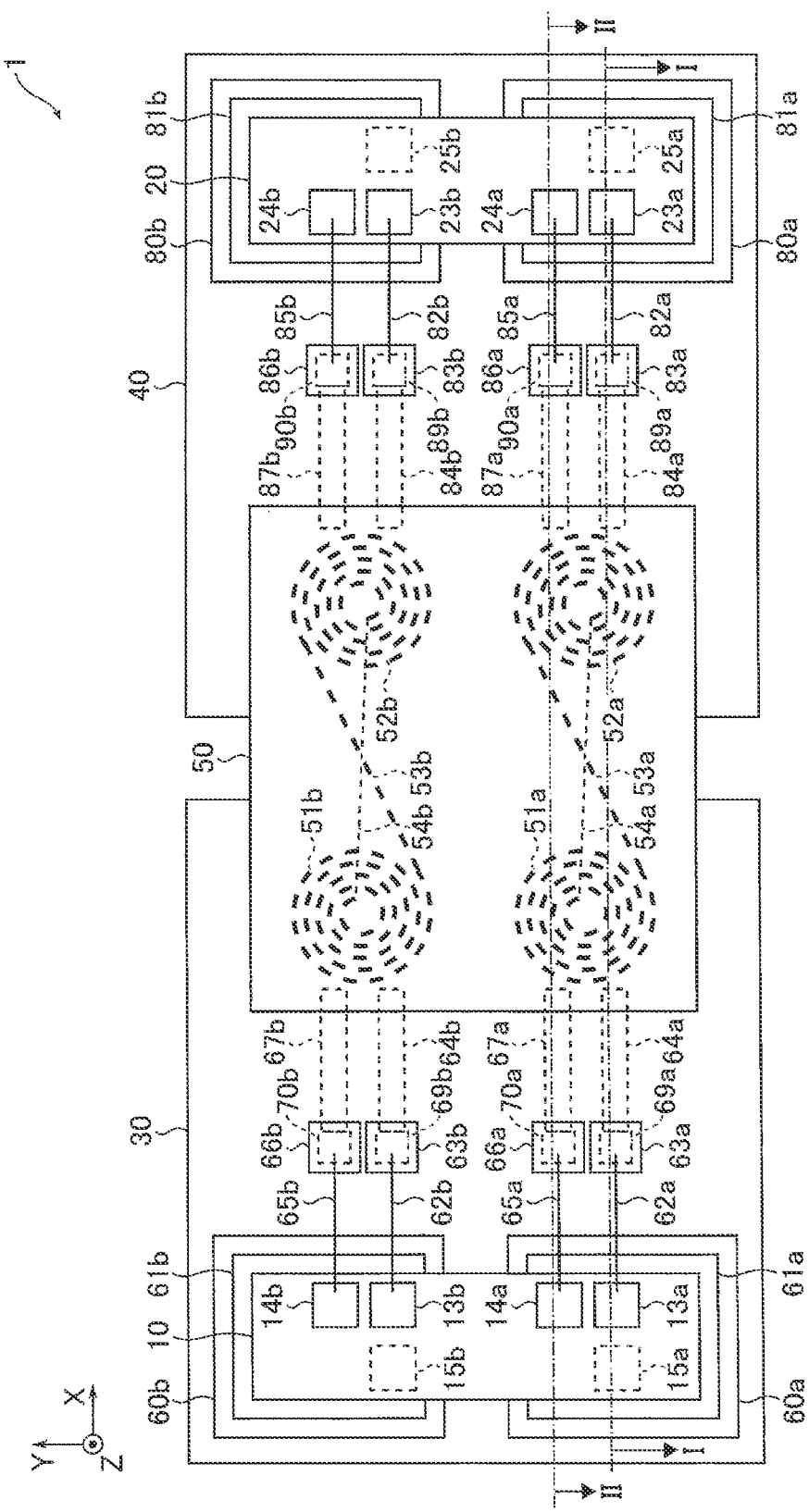
FIG. 10 is a plan view showing an example of a planar structure of the isolator according to the second modification of the first embodiment.

FIG. 10 is a plan view showing an example of the planar structure of the isolator 1. FIG. 10 omits the external electrode terminals T1a, T1b, T2a, and T2b, the coils 31a, 31b, 41a, and 41b, the vias 68a, 68b, 88a, and 88b, the insulator 100, and the resin 110.

As shown in FIG. 10, the coils 51a, 51b, 52a, and 52b, and the interconnects 53a, 53b, 54a, and 54b are provided inside the wiring board 50.

The remaining part of the planer structure of the isolator 1 shown in FIG. 10 is similar to that of FIG. 3 described in the first embodiment.

The planer structure of the isolator 1 as viewed from the second surface P2 side of the wiring board 30 and the fourth surface P4 side of the wiring board 40 is similar to that shown in FIG. 4 described in the first embodiment.

(Cross-Sectional Structure)

Figure 11:
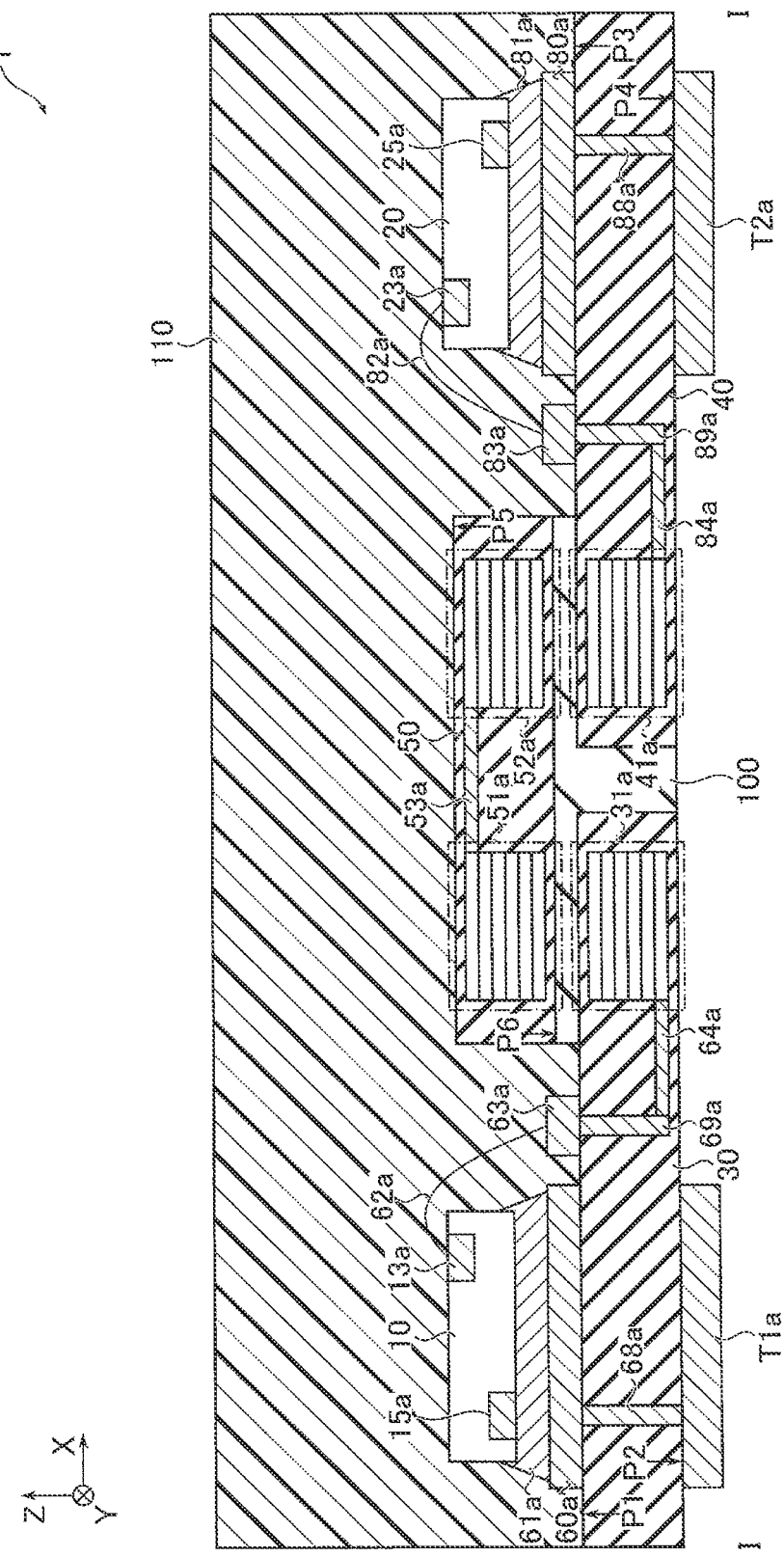
FIG. 11 is a sectional view showing an example of a sectional structure of the isolator according to the second modification of the first embodiment.

FIG. 11 is a sectional view showing an example of a sectional structure of the isolator 1. FIG. 11 is a sectional view taken along the line I-I shown in FIG. 4, FIG. 9, and FIG. 10.

As shown in FIG. 11, the coil 31a and the interconnects 64a and 69a are provided inside the wiring board 30.

One end of the interconnect 69a is in contact with one end of the interconnect 64a. The other end of the interconnect 69a is in contact with the pad 63a. The other end of the interconnect 64a is in contact with the first end of the coil 31a.

The coil 41a and the interconnects 84a and 89a are provided inside the wiring board 40.

One end of the interconnect 89a is in contact with one end of the interconnect 84a. The other end of the interconnect 89a is in contact with the pad 83a. The other end of the interconnect 84a is in contact with the first end of the coil 41a.

The coils 51a and 52a and the interconnect 53a are provided inside the wiring board 50.

One end of the interconnect 53a is in contact with the first end of the coil 51a. The other end of the interconnect 53a is in contact with the first end of the coil 52a.

An interval between the coil 31a and the coil 51a is determined by, for example, a coefficient of magnetic coupling between the coil 31a and the coil 51a and a dielectric strength voltage of the insulator 100 and the wiring board 30. An interval between the coil 41a and the coil 52a is determined by, for example, a coefficient of magnetic coupling between the coil 41a and the coil 52a and a dielectric strength voltage of the insulator 100 and the wiring board 40.

Part of the first surface P1 of the wiring board 30, a surface, which faces the wiring board 40, of the wiring board 30, part of the third surface P3 of the wiring board 40, a surface, which faces the wiring board 30, of the wiring board 40, and all of the sixth surface P6 of the wiring board 50 are covered with the insulator 100.

The first surface P1 of the wiring board 30, the conductor 60a, the attachment member 61a, the chip 10, the interconnect 62a, the pad 63a, the third surface P3 of the wiring board 40, the conductor 80a, the attachment member 81a, the chip 20, the interconnect 82a, the pad 83a, the wiring board 50, and the insulator 100 are covered with the resin 110.

The remaining part of the sectional structure of the isolator 1 shown in FIG. 11 is similar to that of FIG. 5 described in the first embodiment.

FIG. 12 is a sectional view showing an example of a sectional structure of the isolator 1. FIG. 12 is a sectional view taken along the line II-II shown in FIG. 4, FIG. 9, and FIG. 10.

As shown in FIG. 12, the interconnects 67a and 70a are provided inside the wiring board 30.

One end of the interconnect 70a is in contact with one end of the interconnect 67a. The other end of the interconnect 70a is in contact with the pad 66a. The other end of the interconnect 67a is in contact with the second end of the coil 31a.

The interconnects 87a and 90a are provided inside the wiring board 40.

One end of the interconnect 90a is in contact with one end of the interconnect 87a. The other end of the interconnect 90a is in contact with the pad 86a. The other end of the interconnect 87a is in contact with the second end of the coil 41a.

The interconnect 54a is provided inside the wiring board 50.

One end of the interconnect 54a is in contact with the second end of the coil 51a. The other end of the interconnect 54a is in contact with the second end of the coil 52a.

The remaining part of the sectional structure of the isolator 1 shown in FIG. 12 is similar to that of FIG. 6 described in the first embodiment.

The structure described above is the sectional structure of the first transmission circuit TCa of the isolator 1. The sectional structure of the second transmission circuit TCb of the isolator 1 is similar to the sectional structure of the first transmission circuit TCa.

In the present modification, the coils 31a and 31b are provided inside the wiring board 30. The coils 41a and 41b are provided inside the wiring board 40. The coils 51a, 51b, 52a, and 52b are provided inside the wiring board 50. That is, as with the first embodiment, in the present modification, the coils 31a, 31b, 51a, and 51b are not provided on the chip 10, and the coils 41a, 41b, 52a, and 52b are not provided on the chip 20. Furthermore, as with the first embodiment, in the present modification, the wiring boards 30, 40, and 50 are used as members in which a chip, a coil, an interconnect, etc., are arranged. In addition, as with the first embodiment, in the present modification, the external electrode terminals T1a and T1b are provided on the second surface P2 of the wiring board 30, and the external electrode terminals T2a and T2b are provided on the fourth surface P4 of the wiring board 40. Therefore, the present modification enables size reduction of a semiconductor package.

2. Second Embodiment

An isolator according to a second embodiment will be described. The isolator 1 according to the second embodiment differs from that of the first embodiment in terms of inner structure. The following will omit a description of a configuration similar to that of the first embodiment and will mainly provide a description of a configuration different from that of the first embodiment.

2.1 Structure of Isolator

A structure of the isolator 1 will be described.

(Planar Structure)

Figure 13:
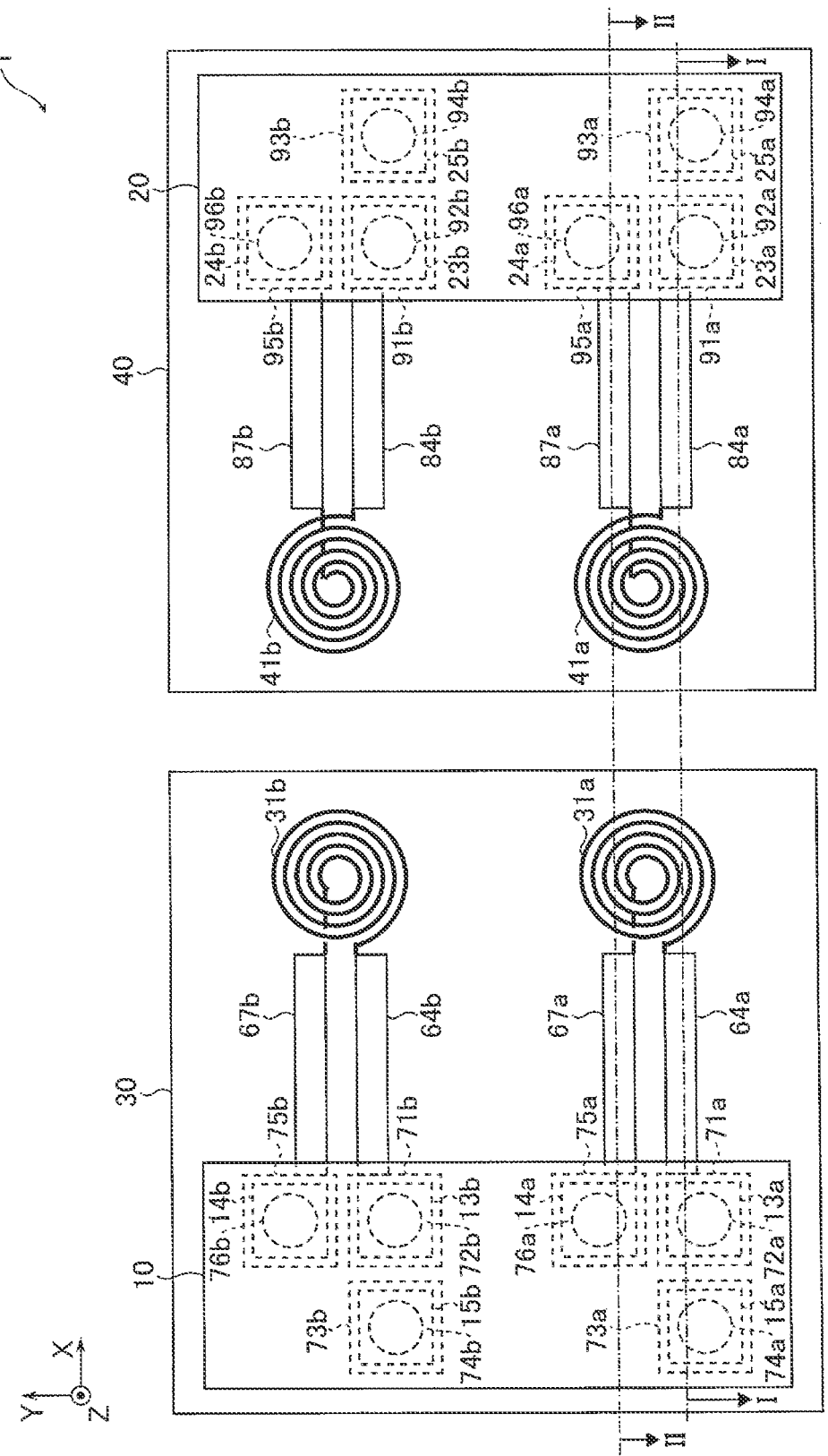
FIG. 13 is a plan view showing an example of a planar structure of an isolator according to a second embodiment.

FIG. 13 is a plan view showing an example of the planar structure of the isolator 1.

In addition to the constituent elements described in the first embodiment, the isolator 1 further includes conductors 71a and 71b, bumps 72a and 72b, conductors 73a and 73b, bumps 74a and 74b, conductors 75a and 75b, bumps 76a and 76*b*, conductors 91*a* and 91*b*, bumps 92*a* and 92*b*, conductors 93*a* and 93*b*, bumps 94*a* and 94*b*, conductors 95*a* and 95*b*, and bumps 96*a* and 96*b*. The conductors 60*a* and 60*b*, the attachment members 61*a* and 61*b*, the interconnects 62*a* and 62*b*, the pads 63*a* and 63*b*, the interconnects 65*a* and 65*b*, the pads 66*a* and 66*b*, the conductors 80*a* and 80*b*, the attachment members 81*a* and 81*b*, the interconnects 82*a* and 82*b*, the pads 83*a* and 83*b*, the interconnects 85*a* and 85*b*, and the pads 86*a* and 86*b* are eliminated. FIG. 13 omits the external electrode terminals T1*a*, T1*b*, T2*a*, and T2*b*, the wiring board 50, the coils 51*a*, 51*b*, 52*a*, and 52*b*, the interconnects 53*a*, 53*b*, 54*a*, and 54*b*, vias 68*a*, 68*b*, 88*a*, and 88*b*, the insulator 100, and the resin 110.

As shown in FIG. 13, the conductors 71*a*, 71*b*, 73*a*, 73*b*, 75*a*, and 75*b* are each, for example, a member for placing the chip 10 thereon. The conductors 71*a*, 71*b*, 73*a*, 73*b*, 75*a*, and 75*b* are provided on the first surface P1 of the wiring board 30. The conductors 71*a*, 71*b*, 73*a*, 73*b*, 75*a*, and 75*b* are each formed into, for example, a plate shape. The conductors 71*a*, 71*b*, 73*a*, 73*b*, 75*a*, and 75*b* are formed of, for example, a conductive material. The conductors 71*a*, 71*b*, 73*a*, 73*b*, 75*a*, and 75*b* are, for example, copper foil.

The bump 72*a* is provided on the conductor 71*a*. The bump 72*b* is provided on the conductor 71*b*. The bump 74*a* is provided on the conductor 73*a*. The bump 74*b* is provided on the conductor 73*b*. The bump 76*a* is provided on the conductor 75*a*. The bump 76*b* is provided on the conductor 75*b*. The bumps 72*a*, 72*b*, 74*a*, 74*b*, 76*a*, and 76*b* are formed of, for example, a conductive material. The bumps 72*a*, 72*b*, 74*a*, 74*b*, 76*a*, and 76*b* are, for example, solder.

The chip 10 is provided on the bumps 72*a*, 72*b*, 74*a*, 74*b*, 76*a*, and 76*b*. The pads 13*a*, 13*b*, 14*a*, 14*b*, 15*a*, and 15*b* are provided on the lower surface of the chip 10. The pad 13*a* is used for coupling between the transmission circuit 12*a* and the bump 72*a*. The pad 13*b* is used for coupling between the transmission circuit 12*b* and the bump 72*b*. The pad 14*a* is used for coupling between the transmission circuit 12*a* and the bump 76*a*. The pad 14*b* is used for coupling between the transmission circuit 12*b* and the bump 76*b*. The pad 15*a* is used for coupling between the electric circuit 11*a* and the bump 74*a*. The pad 15*b* is used for coupling between the electric circuit 11*b* and the bump 74*b*.

One end of the interconnect 64*a* is coupled to the conductor 71*a*. The other end of the interconnect 64*a* is coupled to the first end of the coil 31*a*. One end of the interconnect 64*b* is coupled to the conductor 71*b*. The other end of the interconnect 64*b* is coupled to the first end of the coil 31*b*. The interconnect 64*a* couples electrically between the conductor 71*a* and the first end of the coil 31*a*. The interconnect 64*b* couples electrically between the conductor 71*b* and the first end of the coil 31*b*.

One end of the interconnect 67*a* is coupled to the conductor 75*a*. The other end of the interconnect 67*a* is coupled to the second end of the coil 31*a*. One end of the interconnect 67*b* is coupled to the conductor 75*b*. The other end of the interconnect 67*b* is coupled to the second end of the coil 31*b*. The interconnect 67*a* couples electrically between the conductor 75*a* and the second end of the coil 31*a*. The interconnect 67*b* couples electrically between the conductor 75*b* and the second end of the coil 31*b*.

The conductors 91*a*, 91*b*, 93*a*, 93*b*, 95*a*, and 95*b* are each, for example, a member for placing the chip 20 thereon. The conductors 91*a*, 91*b*, 93*a*, 93*b*, 95*a*, and 95*b* are provided on the third surface P3 of the wiring board 40. The conductors 91*a*, 91*b*, 93*a*, 93*b*, 95*a*, and 95*b* are each formed into, for example, a plate shape. The conductors 91*a*, 91*b*, 93*a*, 93*b*, 95*a*, and 95*b* are formed of, for example, a conductive material. The conductors 91*a*, 91*b*, 93*a*, 93*b*, 95*a*, and 95*b* are, for example, copper foil.

The bump 92*a* is provided on the conductor 91*a*. The bump 92*b* is provided on the conductor 91*b*. The bump 94*a* is provided on the conductor 93*a*. The bump 94*b* is provided on the conductor 93*b*. The bump 96*a* is provided on the conductor 95*a*. The bump 96*b* is provided on the conductor 95*b*. The bumps 92*a*, 92*b*, 94*a*, 94*b*, 96*a*, and 96*b* are formed of, for example, a conductive material. The bumps 92*a*, 92*b*, 94*a*, 94*b*, 96*a*, and 96*b* are, for example, solder.

The chip 20 is provided on the bumps 92*a*, 92*b*, 94*a*, 94*b*, 96*a*, and 96*b*. The pads 23*a*, 23*b*, 24*a*, 24*b*, 25*a*, and 25*b* are provided on the lower surface of the chip 20. The pad 23*a* is used for coupling between the reception circuit 21*a* and the bump 92*a*. The pad 23*b* is used for coupling between the reception circuit 21*b* and the bump 92*b*. The pad 24*a* is used for coupling between the reception circuit 21*a* and the bump 96*a*. The pad 24*b* is used for coupling between the reception circuit 21*b* and the bump 96*b*. The pad 25*a* is used for coupling between the electric circuit 22*a* and the bump 94*a*. The pad 25*b* is used for coupling between the electric circuit 22*b* and the bump 94*b*.

One end of the interconnect 84*a* is coupled to the conductor 91*a*. The other end of the interconnect 84*a* is coupled to the first end of the coil 41*a*. One end of the interconnect 84*b* is coupled to the conductor 91*b*. The other end of the interconnect 84*b* is coupled to the first end of the coil 41*b*. The interconnect 84*a* couples electrically between the conductor 91*a* and the first end of the coil 41*a*. The interconnect 84*b* couples electrically between the conductor 91*b* and the first end of the coil 41*b*.

One end of the interconnect 87*a* is coupled to the conductor 95*a*. The other end of the interconnect 87*a* is coupled to the second end of the coil 41*a*. One end of the interconnect 87*b* is coupled to the conductor 95*b*. The other end of the interconnect 87*b* is coupled to the second end of the coil 41*b*. The interconnect 87*a* couples electrically between the conductor 95*a* and the second end of the coil 41*a*. The interconnect 87*b* couples electrically between the conductor 95*b* and the second end of the coil 41*b*.

Figure 14:
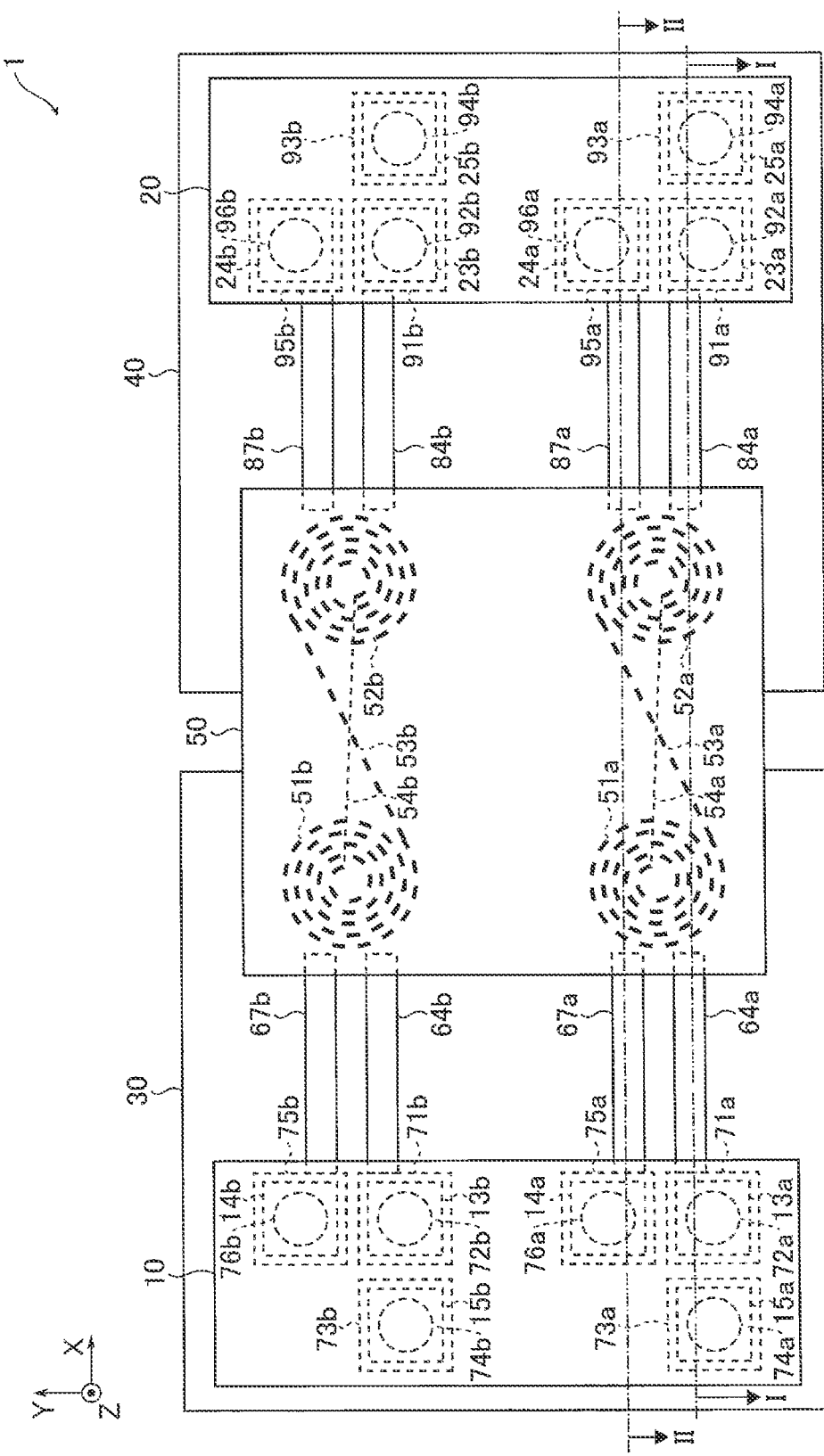
FIG. 14 is a plan view showing an example of a planar structure of the isolator according to the second embodiment.

FIG. 14 is a plan view showing an example of the planar structure of the isolator 1. FIG. 14 omits the external electrode terminals T1*a*, T1*b*, T2*a*, and T2*b*, the coils 31*a*, 31*b*, 41*a*, and 41*b*, the vias 68*a*, 68*b*, 88*a*, and 88*b*, the insulator 100, and the resin 110.

The wiring board 50, the coils 51*a*, 51*b*, 52*a*, 52*b*, and the interconnects 53*a*, 53*b*, 54*a*, and 54*b* are similar to those shown in FIG. 3 described in the first embodiment.

Figure 15:
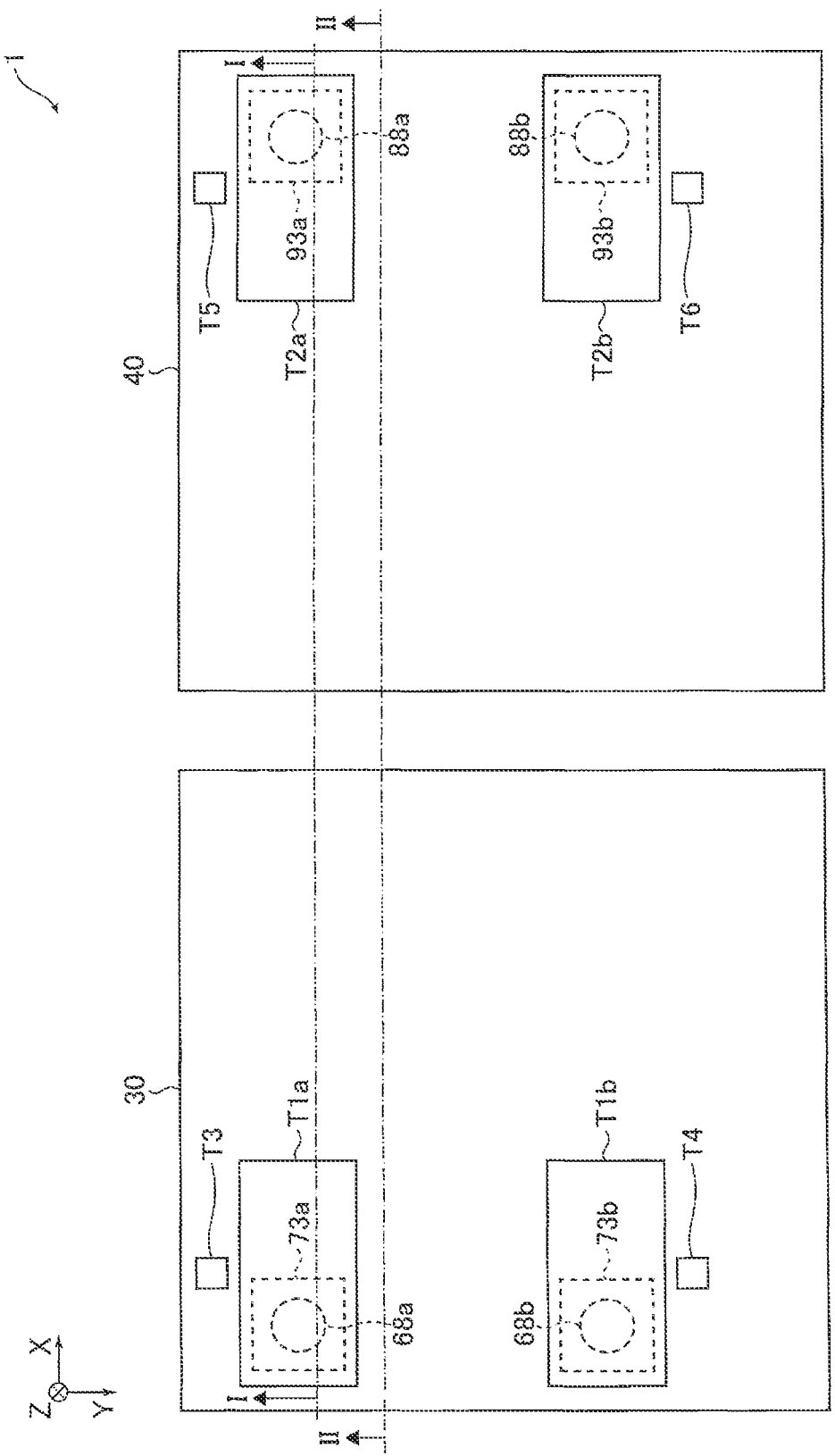
FIG. 15 is a plan view showing an example of a planar structure of the isolator according to the second embodiment.

FIG. 15 is a plan view showing an example of the planar structure of the isolator 1. FIG. 15 is a plan view of the isolator 1 as viewed from the second surface P2 side of the wiring board 30 and the fourth surface P4 side of the wiring board 40. FIG. 15 omits the chips 10 and 20, the coils 31*a*, 31*b*, 41*a*, and 41*b*, the wiring board 50, the coils 51*a*, 51*b*, 52*a*, and 52*b*, the interconnects 53*a*, 53*b*, 54*a*, and 54*b*, the interconnects 64*a*, 64*b*, 67*a*, and 67*b*, the conductors 71*a* and 71*b*, the bumps 72*a* and 72*b*, the bumps 74*a* and 74*b*, the conductors 75*a* and 75*b*, the bumps 76*a* and 76*b*, the interconnects 84*a*, 84*b*, 87*a*, and 87*b*, the conductors 91*a* and 91*b*, the bumps 92*a* and 92*b*, the bumps 94*a* and 94*b*, the conductors 95*a* and 95*b*, the bumps 96*a* and 96*b*, the insulator 100, and the resin 110.

As shown in FIG. 15, one end of the via 68*a* is coupled to the conductor 73*a*. The other end of the via 68*a* is coupled to the external electrode terminal T1*a*. One end of the via 68*b* is coupled to the conductor 73*b*. The other end of the via 68b is coupled to the external electrode terminal T1b. The via 68a couples electrically between the conductor 73a and the external electrode terminal T1a. The via 68b couples electrically between the conductor 73b and the external electrode terminal T1b.

One end of the via 88a is coupled to the conductor 93a. The other end of the via 88a is coupled to the external electrode terminal T2a. One end of the via 88b is coupled to the conductor 93b. The other end of the via 88b is coupled to the external electrode terminal T2b. The via 88a couples electrically between the conductor 93a and the external electrode terminal T2a. The via 88b couples electrically between the conductor 93b and the external electrode terminal T2b.

The remaining part of the sectional structure of the isolator 1 shown in FIG. 15 is similar to that of FIG. 4 described in the first embodiment.

(Cross-Sectional Structure)

Figure 16:
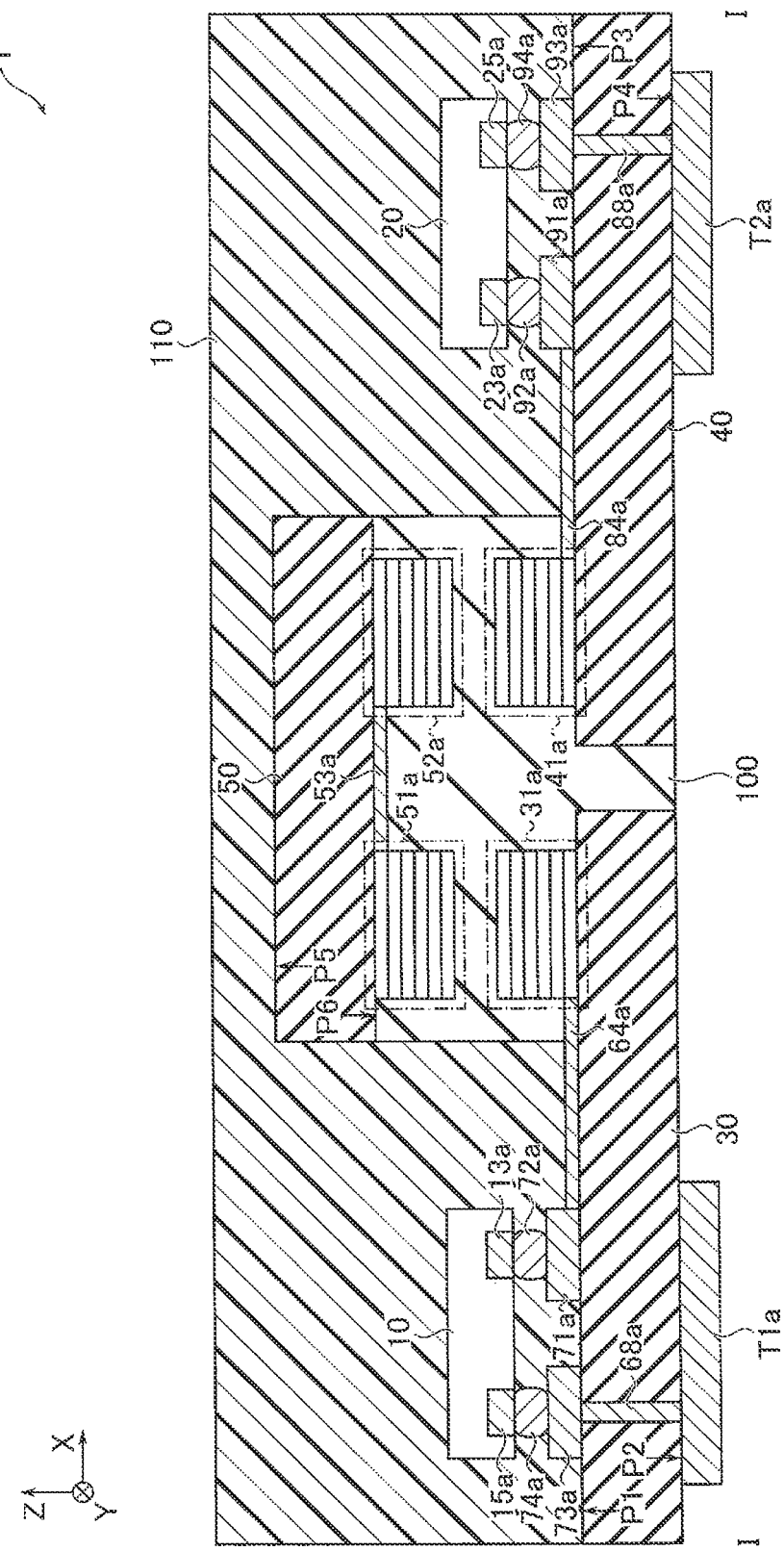
FIG. 16 is a sectional view showing an example of a sectional structure of the isolator according to the second embodiment.

FIG. 16 is a sectional view showing an example of a sectional structure of the isolator 1. FIG. 16 is a sectional view taken along the line I-I shown in FIG. 13 to FIG. 15.

As shown in FIG. 16, the conductors 71a and 73a are provided on the first surface P1 of the wiring board 30. The conductor 71a is in contact with one end of the interconnect 64a. The conductor 73a is in contact with the via 68a. The bump 72a is provided on the conductor 71a. The bump 74a is provided on the conductor 73a. The chip 10 is provided on the bumps 72a and 74a. The pad 13a of the chip 10 is electrically coupled to the first end of the coil 31a with the bump 72a, the conductor 71a, and the interconnect 64a intervening therebetween. The pad 15a of the chip 10 is electrically coupled to the external electrode terminal T1a with the bump 74a, the conductor 73a, and the via 68a intervening therebetween.

The conductors 91a and 93a are provided on the third surface P3 of the wiring board 40. The conductor 91a is in contact with one end of the interconnect 84a. The conductor 93a is in contact with the via 88a. The bump 92a is provided on the conductor 91a. The bump 94a is provided on the conductor 93a. The chip 20 is provided on the bumps 92a and 94a. The pad 23a of the chip 20 is electrically coupled to the first end of the coil 41a with the bump 92a, the conductor 91a, and the interconnect 84a intervening therebetween. The pad 25a of the chip 20 is electrically coupled to the external electrode terminal T2a with the bump 94a, the conductor 93a, and the via 88a intervening therebetween.

The remaining part of the sectional structure of the isolator 1 shown in FIG. 16 is similar to that of FIG. 5 described in the first embodiment.

Figure 17:
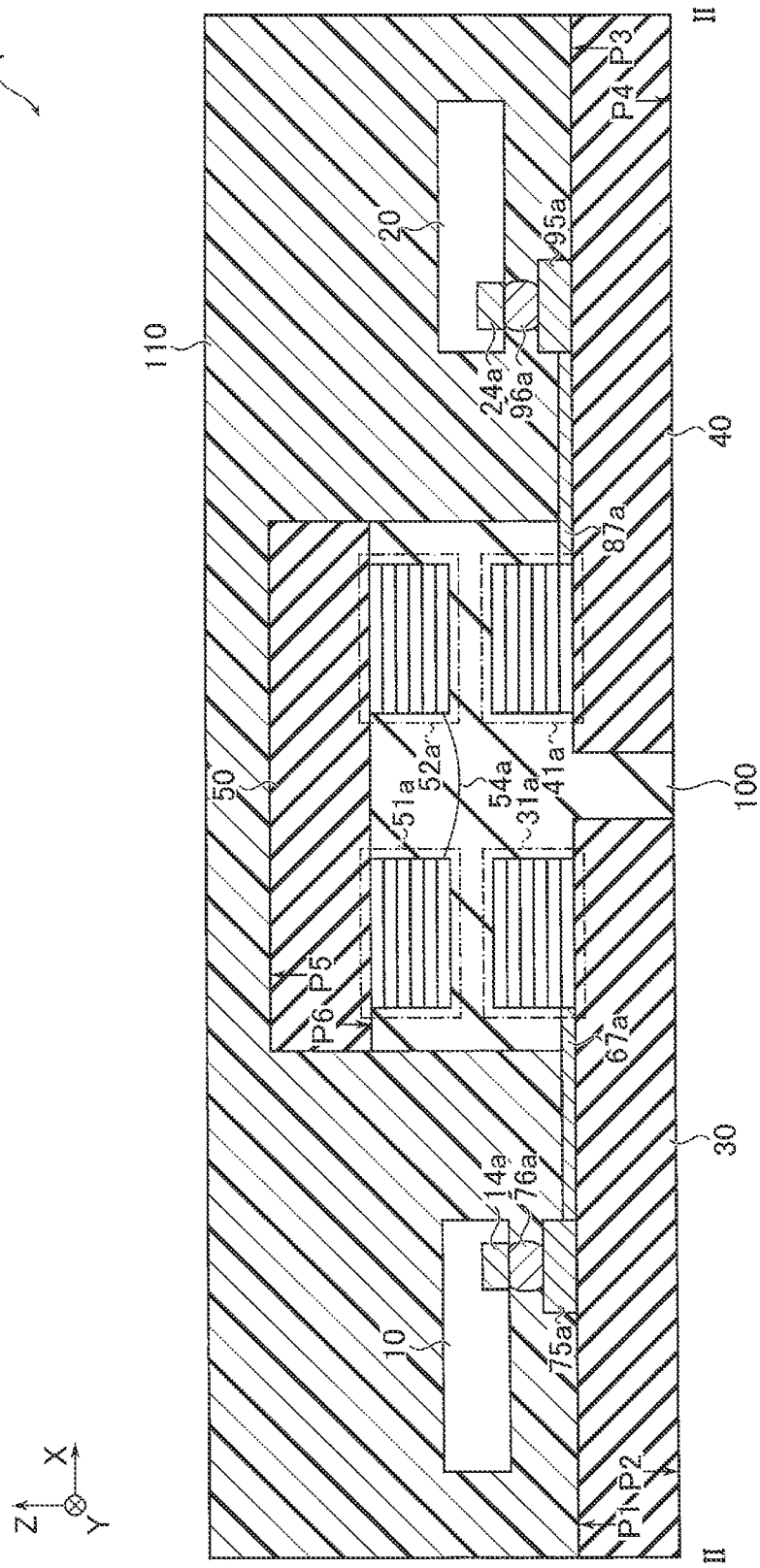
FIG. 17 is a sectional view showing an example of a sectional structure of the isolator according to the second embodiment.

FIG. 17 is a sectional view showing an example of a sectional structure of the isolator 1. FIG. 17 is a sectional view taken along the line II-II shown in FIG. 13 to FIG. 15.

As shown in FIG. 17, the conductor 75a is provided on the first surface P1 of the wiring board 30. The conductor 75a is in contact with one end of the interconnect 67a. The bump 76a is provided on the conductor 75a. The chip 10 is provided on the bump 76a. The pad 14a of the chip 10 is electrically coupled to the second end of the coil 31a with the bump 76a, the conductor 75a, and the interconnect 67a intervening therebetween.

The conductor 95a is provided on the third surface P3 of the wiring board 40. The conductor 95a is in contact with one end of the interconnect 87a. The bump 96a is provided on the conductor 95a. The chip 20 is provided on the bump 96a. The pad 24a of the chip 20 is electrically coupled to the second end of the coil 41a with the bump 96a, the conductor 95a, and the interconnect 87a intervening therebetween.

The remaining part of the sectional structure of the isolator 1 shown in FIG. 17 is similar to that of FIG. 6 described in the first embodiment.

The structure described above is the sectional structure of the first transmission circuit TCa of the isolator 1. The sectional structure of the second transmission circuit TCb of the isolator 1 is similar to the sectional structure of the first transmission circuit TCa.

The present embodiment enables size reduction of a semiconductor package.

2.2 First Modification

An isolator according to a first modification of the second embodiment will be described. The isolator 1 according to the first modification of the second embodiment differs from that of the second embodiment in that the coils 31a, 31b, 41a, 41b, 51a, 51b, 52a, and 52b are covered with a resin. The following will omit a description of a configuration similar to that of the second embodiment and will mainly provide a description of a configuration different from that of the second embodiment.

2.2.1 Structure of Isolator

A structure of the isolator 1 will be described.

The planer structure of the isolator 1 is similar to those shown in FIG. 13 to FIG. 15 described in the second embodiment.

Figure 18:
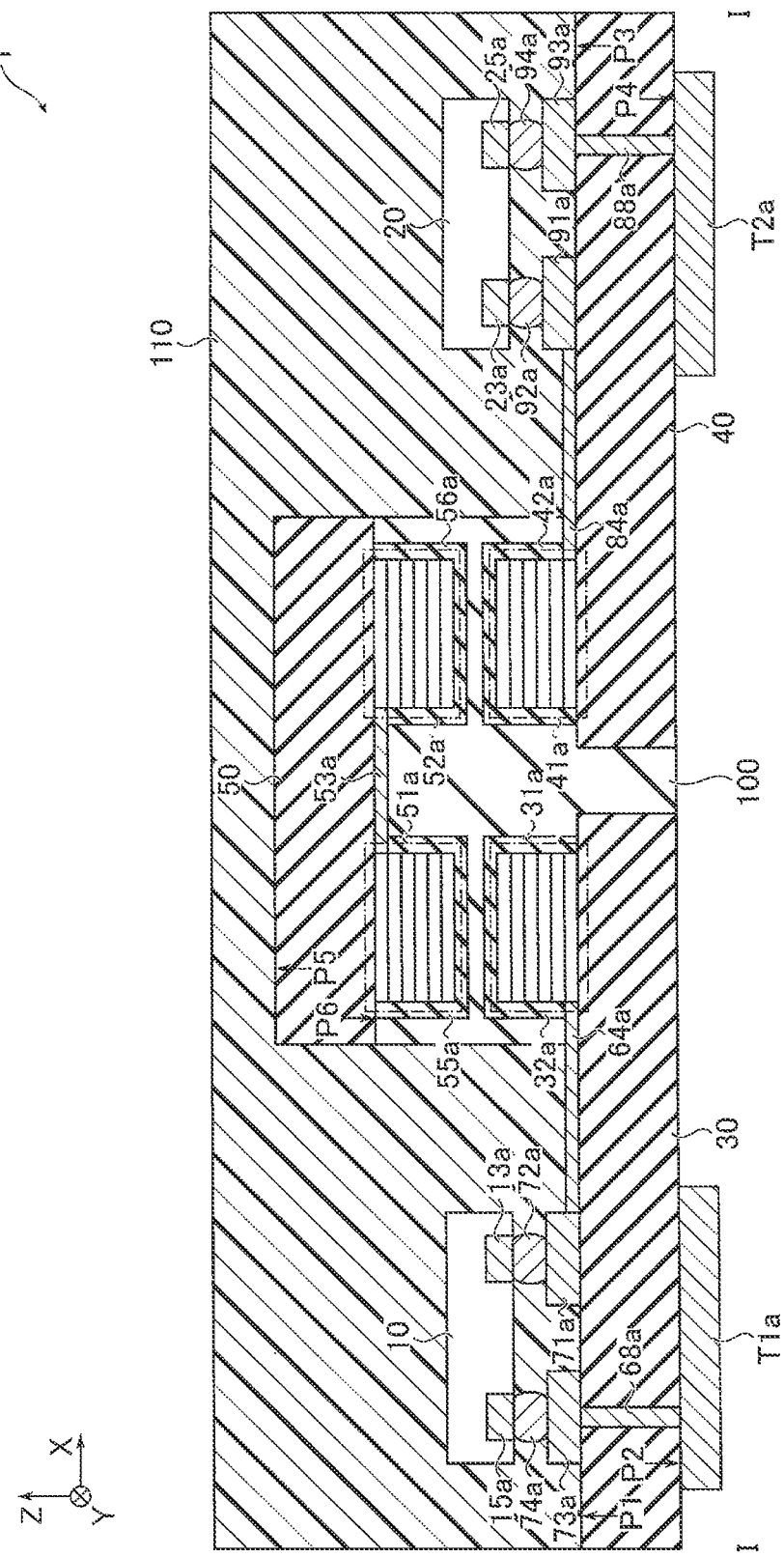
FIG. 18 is a sectional view showing an example of a sectional structure of an isolator according to a first modification of the second embodiment.

FIG. 18 is a sectional view showing an example of a sectional structure of the isolator 1. FIG. 18 is a sectional view taken along the line I-I shown in FIG. 13 to FIG. 15.

As shown in FIG. 18, the remaining part of the coil 31a excluding its first end coupled to the interconnect 64a is covered with a resin 32a. The remaining part of the coil 41a excluding its first end coupled to the interconnect 84a is covered with a resin 42a. The remaining part of the coil 51a excluding its first end coupled to the interconnect 53a is covered with a resin 55a. The remaining part of the coil 52a excluding its first end coupled to the interconnect 53a is covered with a resin 56a.

The resins 32a, 42a, 55a, and 56a are covered with the insulator 100. In other words, the resin 32a is provided between the coil 31a and the insulator 100. The resin 42a is provided between the coil 41a and the insulator 100. The resin 55a is provided between the coil 51a and the insulator 100. The resin 56a is provided between the coil 52a and the insulator 100.

The remaining part of the sectional structure of the isolator 1 shown in FIG. 18 is similar to that of FIG. 16 described in the second embodiment.

Figure 19:
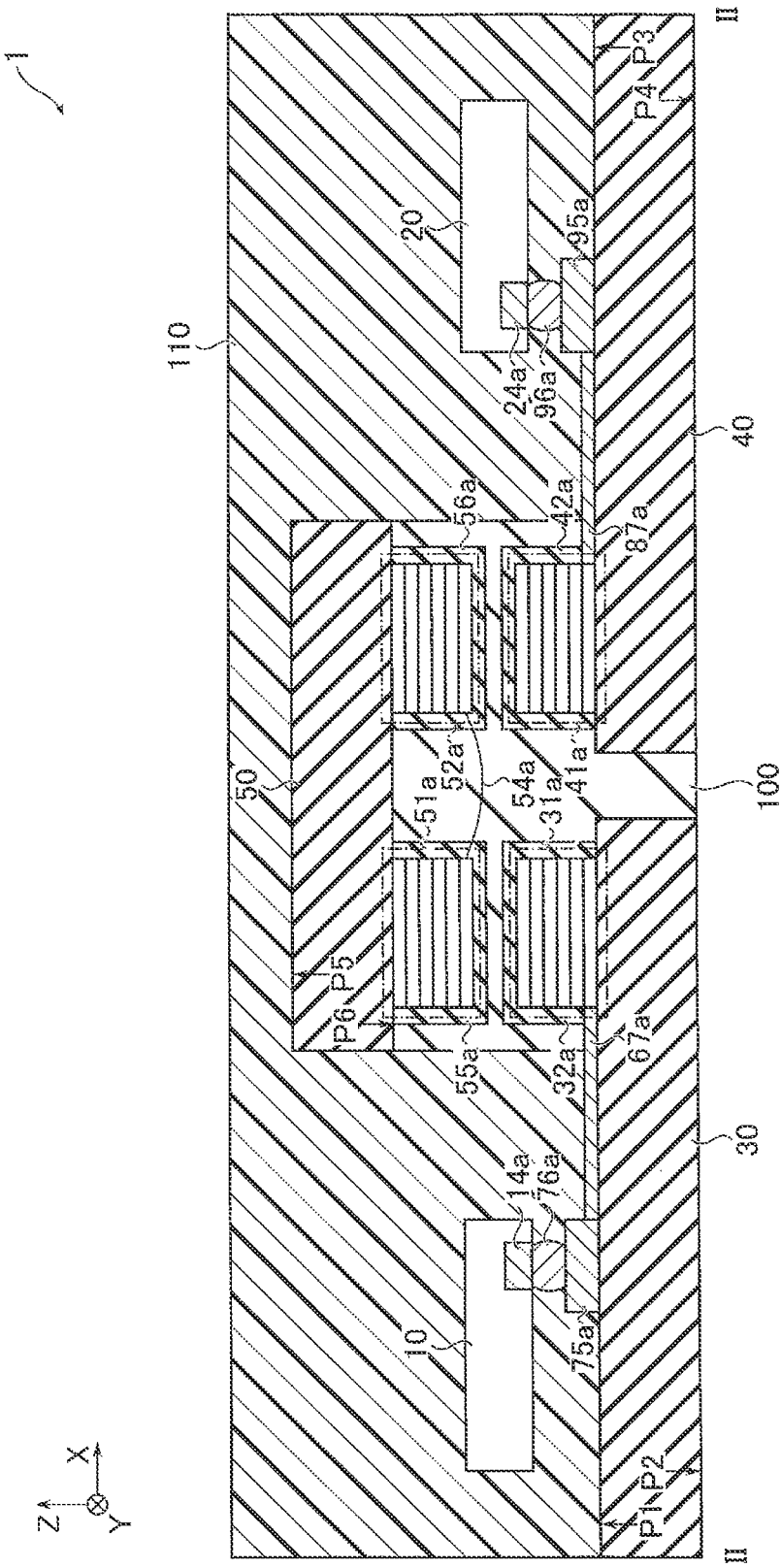
FIG. 19 is a sectional view showing an example of a sectional structure of the isolator according to the first modification of the second embodiment.

FIG. 19 is a sectional view showing an example of a sectional structure of the isolator 1. FIG. 19 is a sectional view taken along the line II-II of FIG. 13 shown in FIG. 15.

As shown in FIG. 19, the remaining part of the coil 31a excluding its second end coupled to the interconnect 67a is covered with the resin 32a. The remaining part of the coil 41a excluding its second end coupled to the interconnect 87a is covered with a resin 42a. The remaining part of the coil 51a excluding its second end coupled to the interconnect 54a is covered with the resin 55a. The remaining part of the coil 52a excluding its second end coupled to the interconnect 54a is covered with a resin 56a.

The remaining part of the sectional structure of the isolator 1 shown in FIG. 19 is similar to that of FIG. 17 described in the first embodiment.

The structure described above is the sectional structure of the first transmission circuit TCa of the isolator 1. The sectional structure of the second transmission circuit TCb of the isolator 1 is similar to the sectional structure of the first transmission circuit TCa. That is, the coils 31*b*, 41*b*, 51*b*, and 52*b* are covered with resins 32*b*, 42*b*, 55*b*, and 56*b* (not shown).

The present modification enables size reduction of a semiconductor package.

2.3 Second Modification

An isolator according to a second modification of the second embodiment will be described. The isolator 1 according to the second modification of the second embodiment differs from that of the second embodiment in that the coils 31*a* and 31*b* are provided inside the wiring board 30, the coils 41*a* and 41*b* are provided inside the wiring board 40, and the coils 51*a*, 51*b*, 52*a*, and 52*b* are provided inside the wiring board 50. The following will omit a description of a configuration similar to that of the second embodiment and will mainly provide a description of a configuration different from that of the second embodiment.

2.3.1 Structure of Isolator

A structure of the isolator 1 will be described.

(Planar Structure)

Figure 20:
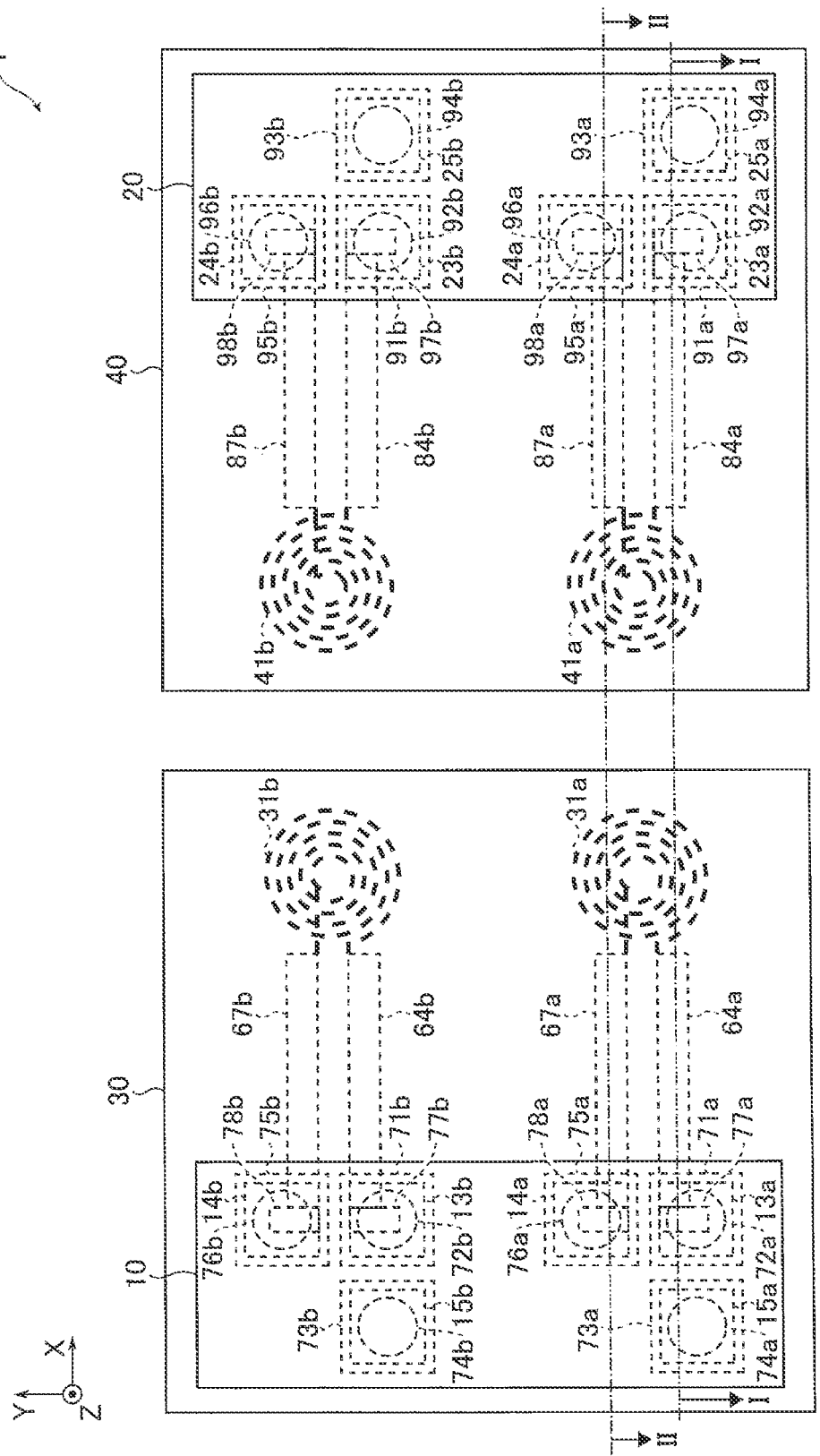
FIG. 20 is a plan view showing an example of a planar structure of an isolator according to a second modification of the second embodiment.

FIG. 20 is a plan view showing an example of the planar structure of the isolator 1.

In addition to the constituent elements described in the second embodiment, the isolator 1 further includes interconnects 77*a*, 77*b*, 78*a*, 78*b*, 97*a*, 97*b*, 98*a*, and 98*b*. FIG. 20 omits the external electrode terminals T1*a*, T1*b*, T2*a*, and T2*b*, the wiring board 50, the coils 51*a*, 51*b*, 52*a*, and 52*b*, the interconnects 53*a*, 53*b*, 54*a*, and 54*b*, vias 68*a*, 68*b*, 88*a*, and 88*b*, the insulator 100, and the resin 110.

As shown in FIG. 20, the coils 31*a* and 31*b* and the interconnects 64*a*, 64*b*, 67*a*, 67*b*, 77*a*, 77*b*, 78*a*, and 78*b* are provided inside the wiring board 30.

One end of the interconnect 64*a* is coupled to one end of the interconnect 77*a*. The other end of the interconnect 64*a* is coupled to the first end of the coil 31*a*. One end of the interconnect 64*b* is coupled to one end of the interconnect 77*b*. The other end of the interconnect 64*b* is coupled to the first end of the coil 31*b*.

One end of the interconnect 67*a* is coupled to one end of the interconnect 78*a*. The other end of the interconnect 67*a* is coupled to the second end of the coil 31*a*. One end of the interconnect 67*b* is coupled to one end of the interconnect 78*b*. The other end of the interconnect 67*b* is coupled to the second end of the coil 31*b*.

The other end of the interconnect 77*a* is coupled to the conductor 71*a*. The other end of the interconnect 77*b* is coupled to the conductor 71*b*. The interconnect 77*a* couples electrically between the conductor 71*a* and the first end of the coil 31*a* with the interconnect 64*a* intervening therebetween. The interconnect 77*b* couples electrically between the conductor 71*b* and the first end of the coil 31*b* with the interconnect 64*b* intervening therebetween. The interconnects 77*a* and 77*b* are each formed of, for example, a conductive material.

The other end of the interconnect 78*a* is coupled to the conductor 75*a*. The other end of the interconnect 78*b* is coupled to the conductor 75*b*. The interconnect 78*a* couples electrically between the conductor 75*a* and the second end of the coil 31*a* with the interconnect 67*a* intervening therebetween. The interconnect 78*b* couples electrically between the conductor 75*b* and the second end of the coil 31*b* with the interconnect 67*b* intervening therebetween. The interconnects 78*a* and 78*b* are each formed of, for example, a conductive material.

The coils 41*a* and 41*b* and the interconnects 84*a*, 84*b*, 87*a*, 87*b*, 97*a*, 97*b*, 98*a*, and 98*b* are provided inside the wiring board 40.

One end of the interconnect 84*a* is coupled to one end of the interconnect 97*a*. The other end of the interconnect 84*a* is coupled to the first end of the coil 41*a*. One end of the interconnect 84*b* is coupled to one end of the interconnect 97*b*. The other end of the interconnect 84*b* is coupled to the first end of the coil 41*b*.

One end of the interconnect 87*a* is coupled to one end of the interconnect 98*a*. The other end of the interconnect 87*a* is coupled to the second end of the coil 41*a*. One end of the interconnect 87*b* is coupled to one end of the interconnect 98*b*. The other end of the interconnect 87*b* is coupled to the second end of the coil 41*b*.

The other end of the interconnect 97*a* is coupled to the conductor 91*a*. The other end of the interconnect 97*b* is coupled to the conductor 91*b*. The interconnect 97*a* couples electrically between the conductor 91*a* and the first end of the coil 41*a* with the interconnect 84*a* intervening therebetween. The interconnect 97*b* couples electrically between the conductor 91*b* and the first end of the coil 41*b* with the interconnect 84*b* intervening therebetween. The interconnects 97*a* and 97*b* are each formed of, for example, a conductive material.

The other end of the interconnect 98*a* is coupled to the conductor 95*a*. The other end of the interconnect 98*b* is coupled to the conductor 95*b*. The interconnect 98*a* couples electrically between the conductor 95*a* and the second end of the coil 41*a* with the interconnect 87*a* intervening therebetween. The interconnect 98*b* couples electrically between the conductor 95*b* and the second end of the coil 41*b* with the interconnect 87*b* intervening therebetween. The interconnects 98*a* and 98*b* are each formed of, for example, a conductive material.

The remaining part of the planer structure of the isolator 1 shown in FIG. 20 is similar to that of FIG. 13 described in the second embodiment.

Figure 21:
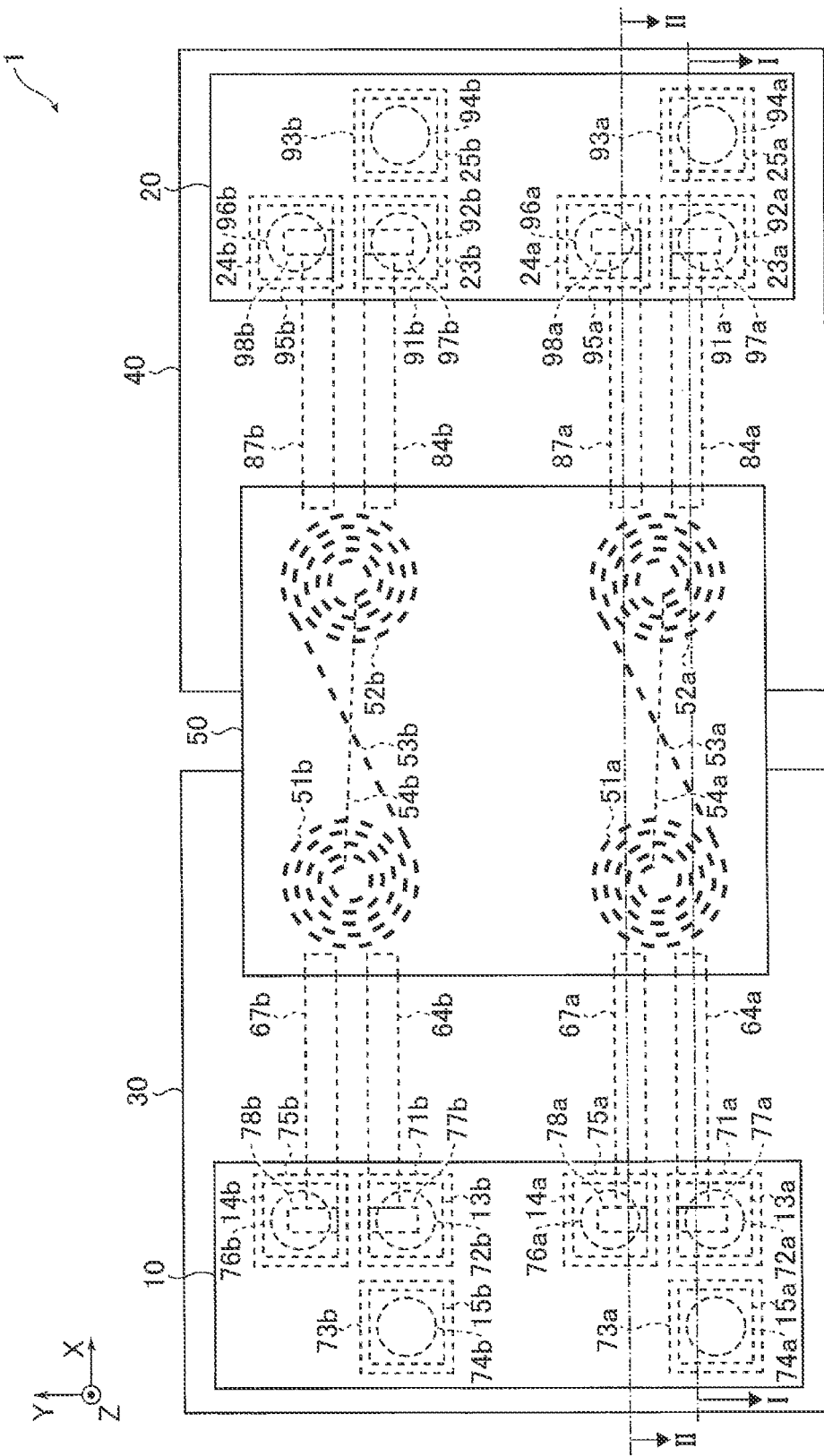
FIG. 21 is a plan view showing an example of a planar structure of the isolator according to the second modification of the second embodiment.

FIG. 21 is a plan view showing an example of the planar structure of the isolator 1. FIG. 21 omits the external electrode terminals T1*a*, T1*b*, T2*a*, and T2*b*, the coils 31*a*, 31*b*, 41*a*, and 41*b*, the vias 68*a*, 68*b*, 88*a*, and 88*b*, the insulator 100, and the resin 110.

As shown in FIG. 21, the coils 51*a*, 51*b*, 52*a*, and 52*b*, and the interconnects 53*a*, 53*b*, 54*a*, and 54*b* are provided inside the wiring board 50.

The remaining part of the planer structure of the isolator 1 shown in FIG. 21 is similar to that of FIG. 14 described in the second embodiment.

The planer structure of the isolator 1 as viewed from the second surface P2 side of the wiring board 30 and the fourth surface P4 side of the wiring board 40 is similar to that shown in FIG. 15 described in the second embodiment.

(Cross-Sectional Structure)

FIG. 22 is a sectional view showing an example of a sectional structure of the isolator 1. FIG. 22 is a sectional view taken along the line I-I shown in FIG. 15, FIG. 20, and FIG. 21.

As shown in FIG. 22, the coil 31*a* and the interconnects 64*a* and 77*a* are provided inside the wiring board 30.

One end of the interconnect 77*a* is in contact with one end of the interconnect 64*a*. The other end of the interconnect 77*a* is in contact with the conductor 71*a*. The other end of the interconnect 64*a* is in contact with the first end of the coil 31*a*.

The coil 41*a* and the interconnects 84*a* and 97*a* are provided inside the interconnect 40.

One end of the interconnect 97a is in contact with one end of the interconnect 84a. The other end of the interconnect 97a is in contact with the conductor 91a. The other end of the interconnect 84a is in contact with the first end of the coil 41a.

The coils 51a and 52a and the interconnect 53a are provided inside the wiring board 50.

One end of the interconnect 53a is in contact with the first end of the coil 51a. The other end of the interconnect 53a is in contact with the first end of the coil 52a.

The remaining part of the sectional structure of the isolator 1 shown in FIG. 22 is similar to that of FIG. 16 described in the second embodiment.

Figure 23:
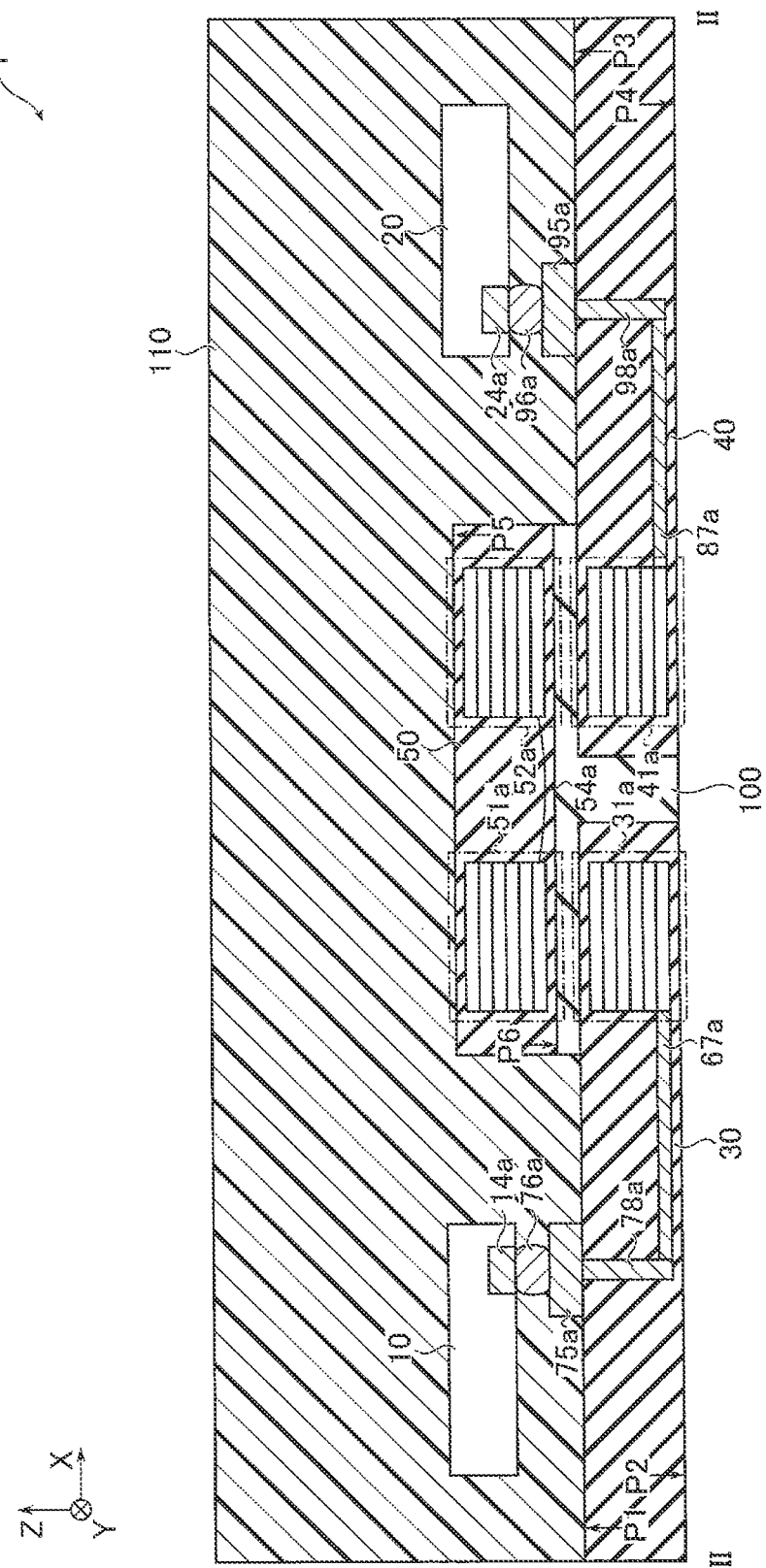
FIG. 23 is a sectional view showing an example of a sectional structure of the isolator according to the second modification of the second embodiment.

FIG. 23 is a sectional view showing an example of a sectional structure of the isolator 1. FIG. 23 is a sectional view taken along the line II-II shown in FIG. 15, FIG. 20, and FIG. 21.

As shown in FIG. 23, the interconnects 67a and 78a are provided inside the wiring board 30.

One end of the interconnect 78a is in contact with one end of the interconnect 67a. The other end of the interconnect 78a is in contact with the conductor 75a. The other end of the interconnect 67a is in contact with the second end of the coil 31a.

The interconnects 87a and 98a are provided inside the wiring board 40.

One end of the interconnect 98a is in contact with one end of the interconnect 87a. The other end of the interconnect 98a is in contact with the conductor 95a. The other end of the interconnect 87a is in contact with the second end of the coil 41a.

The interconnect 54a is provided inside the wiring board 50.

One end of the interconnect 54a is in contact with the second end of the coil 51a. The other end of the interconnect 54a is in contact with the second end of the coil 52a.

The remaining part of the sectional structure of the isolator 1 shown in FIG. 23 is similar to that of FIG. 17 described in the second embodiment.

The structure described above is the sectional structure of the first transmission circuit TCa of the isolator 1. The sectional structure of the second transmission circuit TCb of the isolator 1 is similar to the sectional structure of the first transmission circuit TCa.

The present modification enables size reduction of a semiconductor package.

3. Modification, Etc

As described above, an isolator (1) according to an embodiment includes: a first semiconductor chip (10); a second semiconductor chip (20); a first wiring board (30) including a first surface (P1) facing in a first direction (Z), the first surface (P1) being provided thereon with the first semiconductor chip (10); a second wiring board (40) including a second surface (P3) facing in the first direction (Z), the second surface (P3) being provided thereon with the second semiconductor chip (20), the second wiring board (40) being spaced apart from the first wiring board (30) in a second direction (X) intersecting the first direction (Z); a third wiring board (50) spaced apart from each of the first wiring board (30) and the second wiring board (40) in the first direction (Z); a first coil (31a) provided on the first surface (P1) of the first wiring board (30) and electrically coupled to the first semiconductor chip (10); a second coil (41a) provided on the second surface (P3) of the second wiring board (40) and electrically coupled to the second semiconductor chip (20); a third coil (51a) provided on a third surface (P6) of the third wiring board (50), the third surface (P6) facing the first surface of the first wiring board (30) and the second surface of the second wiring board (40), the third coil (51a) facing the first coil (31a); a fourth coil (52a) provided on the third surface (P6) of the third wiring board (50), facing the second coil (41a), and electrically coupled to the third coil (51a); and an insulator (100) provided between the first coil (31a) and the second coil (41a), between the first coil (31a) and the third coil (51a), between the second coil (41a) and the fourth coil (52a), and between the third coil (51a) and the fourth coil (52a).

The embodiments are not limited to those described in the above, and various modifications can be made.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An isolator comprising:
a first semiconductor chip;
a second semiconductor chip;
a first wiring board including a first surface facing in a first direction, the first surface being provided thereon with the first semiconductor chip;
a second wiring board including a second surface facing in the first direction, the second surface being provided thereon with the second semiconductor chip, the second wiring board being spaced apart from the first wiring board in a second direction intersecting the first direction;
a third wiring board spaced apart from each of the first wiring board and the second wiring board in the first direction;
a first coil provided on the first surface of the first wiring board and electrically coupled to the first semiconductor chip;
a second coil provided on the second surface of the second wiring board and electrically coupled to the second semiconductor chip;
a third coil provided on a third surface of the third wiring board, the third surface facing the first surface of the first wiring board and the second surface of the second wiring board, the third coil facing the first coil;
a fourth coil provided on the third surface of the third wiring board, facing the second coil, and electrically coupled to the third coil; and
an insulator provided between the first coil and the second coil, between the first coil and the third coil, between the second coil and the fourth coil, and between the third coil and the fourth coil.

2. The isolator according to claim 1, wherein the first semiconductor chip includes a first pad and a second pad,
the first pad is electrically coupled to a first end of the first coil,
the second pad is electrically coupled to a second end of the first coil,
the second semiconductor chip includes a third pad and a fourth pad, the third pad is electrically coupled to a first end of the second coil, and the fourth pad is electrically coupled to a second end of the second coil.

3. The isolator according to claim 2, further comprising:
a first wire;
a second wire;
a third wire; and
a fourth wire,
wherein the first pad is electrically coupled to the first end of the first coil with the first wire intervening between the first pad and the first end of the first coil, the second pad is electrically coupled to the second end of the first coil with the second wire intervening between the second pad and the second end of the first coil, the third pad is electrically coupled to the first end of the second coil with the third wire intervening between the third pad and the first end of the second coil, and the fourth pad is electrically coupled to the second end of the second coil with the fourth wire intervening between the fourth pad and the second end of the second coil.

4. The isolator according to claim 2, further comprising:
a first conductor and a second conductor both provided on the first surface of the first wiring board; and
a third conductor and a fourth conductor both provided on the second surface of the second wiring board,
wherein the first pad is electrically coupled to the first end of the first coil with the first conductor intervening between the first pad and the first end of the first coil, the second pad is electrically coupled to the second end of the first coil with the second conductor intervening between the second pad and the second end of the first coil, the third pad is electrically coupled to the first end of the second coil with the third conductor intervening between the third pad and the first end of the second coil, and the fourth pad is electrically coupled to the second end of the second coil with the fourth conductor intervening between the fourth pad and the second end of the second coil.

5. The isolator according to claim 1, further comprising:
a first electrode terminal provided on a fourth surface of the first wiring board, the fourth surface facing the first surface; and
a second electrode terminal provided on a fifth surface of the second wiring board, the fifth surface facing the second surface.

6. The isolator according to claim 5, wherein the first semiconductor chip includes a fifth pad,
the fifth pad is electrically coupled to the first electrode terminal,
the second semiconductor chip includes a sixth pad, and
the sixth pad is electrically coupled to the second electrode terminal.

7. The isolator according to claim 6, further comprising:
a first via extending in the second direction and penetrating the first wiring board; and
a second via extending in the second direction and penetrating the second wiring board,
wherein the fifth pad is electrically coupled to the first electrode terminal with the first via intervening between the fifth pad and the first electrode terminal, and the sixth pad is electrically coupled to the second electrode terminal with the second via intervening between the sixth pad and the second electrode terminal.

8. The isolator according to claim 1, further comprising:
a first resin provided between the first coil and the insulator and covering the first coil;
a second resin provided between the second coil and the insulator and covering the second coil;
a third resin provided between the third coil and the insulator and covering the third coil; and
a fourth resin provided between the fourth coil and the insulator and covering the fourth coil.

9. The isolator according to claim 1, wherein the first wiring board, the second wiring board, and the third wiring board are flexible printed circuits.

10. The isolator according to claim 1, wherein the first coil, the second coil, the third coil, and the fourth coil include copper.

11. The isolator according to claim 1, wherein each of the first coil, the second coil, the third coil, and the fourth coil has a thickness of 6 μm or greater and 12 μm or smaller.

12. The isolator according to claim 8, wherein the first resin, the second resin, the third resin, and the fourth resin are polyimide resin.

13. The isolator according to claim 1, wherein the first semiconductor chip includes a transmission circuit,
the second semiconductor chip includes a reception circuit,
a first signal is input from the transmission circuit to a first end of the first coil,
a second signal is input from the transmission circuit to a second end of the first coil,
a third signal is input from a first end of the second coil to the reception circuit, and
a fourth signal is input from a second end of the second coil to the reception circuit.

14. An isolator comprising:
a first semiconductor chip;
a second semiconductor chip;
a first wiring board including a first surface facing in a first direction, the first surface being provided thereon with the first semiconductor chip;
a second wiring board including a second surface facing in the first direction, the second surface being provided thereon with the second semiconductor chip, the second wiring board being spaced apart from the first wiring board in a second direction intersecting the first direction;
a third wiring board spaced apart from each of the first wiring board and the second wiring board in the first direction;
a first coil provided inside the first wiring board and electrically coupled to the first semiconductor chip;
a second coil provided inside the second wiring board and electrically coupled to the second semiconductor chip;
a third coil provided inside the third wiring board, the third coil facing to the first coil;
a fourth coil provided inside the third wiring board, facing the second coil, and electrically coupled to the third coil; and
an insulator provided between the first wiring board and the second wiring board, between the first wiring board and the third wiring board, and between the second wiring board and the third wiring board.

15. The isolator according to claim 14, wherein the first semiconductor chip includes a first pad and a second pad, the first pad is electrically coupled to a first end of the first coil, the second pad is electrically coupled to a second end of the first coil, the second semiconductor chip includes a third pad and a fourth pad, the third pad is electrically coupled to a first end of the second coil, and the fourth pad is electrically coupled to a second end of the second coil.

16. The isolator according to claim 15, further comprising:

a first wire;

a second wire;

a third wire; and a fourth wire, wherein the first pad is electrically coupled to the first end of the first coil with the first wire intervening between the first pad and the first end of the first coil, the second pad is electrically coupled to the second end of the first coil with the second wire intervening between the second pad and the second end of the first coil, the third pad is electrically coupled to the first end of the second coil with the third wire intervening between the third pad and the first end of the second coil, and the fourth pad is electrically coupled to the second end of the second coil with the fourth wire intervening between the fourth pad and the second end of the second coil.

17. The isolator according to claim 15, further comprising:

a first conductor and a second conductor both provided on the first surface of the first wiring board; and a third conductor and a fourth conductor both provided on the second surface of the second wiring board, wherein the first pad is electrically coupled to the first end of the first coil with the first conductor intervening between the first pad and the first end of the first coil, the second pad is electrically coupled to the second end of the first coil with the second conductor intervening between the second pad and the second end of the first coil, the third pad is electrically coupled to the first end of the second coil with the third conductor intervening between the third pad and the first end of the second coil, and the fourth pad is electrically coupled to the second end of the second coil with the fourth conductor intervening between the fourth pad and the second end of the second coil.

18. The isolator according to claim 14, further comprising:

a first electrode terminal provided on a fourth surface of the first wiring board, the fourth surface facing the first surface; and a second electrode terminal provided on a fifth surface of the second wiring board, the fifth surface facing the second surface.

19. The isolator according to claim 18, wherein the first semiconductor chip includes a fifth pad, the fifth pad is electrically coupled to the first electrode terminal, the second semiconductor chip includes a sixth pad, and the sixth pad is electrically coupled to the second electrode terminal.

20. The isolator according to claim 19, further comprising:

a first via extending in the second direction and penetrating the first wiring board; and a second via extending in the second direction and penetrating the second wiring board, wherein the fifth pad is electrically coupled to the first electrode terminal with the first via intervening between the fifth pad and the first electrode terminal, and the sixth pad is electrically coupled to the second electrode terminal with the second via intervening between the sixth pad and the second electrode terminal.

* * * * *